(12) United States Patent
Abe et al.

(10) Patent No.: US 9,048,721 B2
(45) Date of Patent: Jun. 2, 2015

(54) SEMICONDUCTOR DEVICE

(75) Inventors: Hidefumi Abe, Tochigi (JP); Seiichiro Abe, Tochigi (JP); Toru Shiba, Tochigi (JP); Takuya Yagi, Tochigi (JP); Toshiro Mayumi, Tochigi (JP)

(73) Assignee: KEIHIN CORPORATION, Tokyo (JP)

( * ) Notice: Subject to any disclaimer, the term of this patent is extended or adjusted under 35 U.S.C. 154(b) by 260 days.

(21) Appl. No.: 13/480,633

(22) Filed: May 25, 2012

(65) Prior Publication Data

US 2013/0075886 A1    Mar. 28, 2013

(30) Foreign Application Priority Data

Sep. 27, 2011 (JP) ................. 2011-210651
Sep. 27, 2011 (JP) ................. 2011-210652

(51) Int. Cl.
*H02M 7/00* (2006.01)

(52) U.S. Cl.
CPC ....... *H02M 7/003* (2013.01); *H01L 2924/0002* (2013.01)

(58) Field of Classification Search
CPC .............................. H01L 23/36; H05K 7/209
USPC ............... 361/679.46–679.54, 688–723; 165/80.1–80.5, 104.33; 257/712–722; 174/15.1–15.2, 16.1–16.3
See application file for complete search history.

(56) References Cited

U.S. PATENT DOCUMENTS

| | | | | |
|---|---|---|---|---|
| 4,392,153 A | * | 7/1983 | Glascock et al. | 257/746 |
| 5,132,777 A | * | 7/1992 | Kloucek | 257/714 |
| 6,091,604 A | * | 7/2000 | Plougsgaard et al. | 361/707 |
| 6,982,873 B2 | * | 1/2006 | Meyer et al. | 361/699 |
| 6,989,590 B2 | * | 1/2006 | Hanada et al. | 257/691 |
| 7,027,302 B2 | * | 4/2006 | Inoue | 361/699 |
| 7,104,312 B2 | * | 9/2006 | Goodson et al. | 165/80.4 |
| 7,679,915 B2 | * | 3/2010 | Isomoto et al. | 361/715 |
| 7,696,532 B2 | * | 4/2010 | Knapp et al. | 257/177 |
| 7,710,721 B2 | * | 5/2010 | Matsuo et al. | 361/699 |
| 7,719,838 B2 | * | 5/2010 | Nakajima et al. | 361/699 |
| 7,826,226 B2 | * | 11/2010 | Ishiyama | 361/699 |
| 7,835,151 B2 | * | 11/2010 | Olesen | 361/689 |
| 7,969,735 B2 | * | 6/2011 | Nakatsu et al. | 361/699 |
| 7,978,468 B2 | * | 7/2011 | Nakatsu et al. | 361/689 |

(Continued)

FOREIGN PATENT DOCUMENTS

| | | |
|---|---|---|
| JP | 06-162827 A | 6/1994 |
| JP | 08-149795 A | 6/1996 |

(Continued)

OTHER PUBLICATIONS

Office Action dated Oct. 29, 2014, issued in corresponding Japanese Patent Application No. 2011-210652, with Partial English Translation (4 pages).

(Continued)

*Primary Examiner* — David M Sinclair
*Assistant Examiner* — Robert Brown
(74) *Attorney, Agent, or Firm* — Westerman, Hattori, Daniels & Adrian, LLP

(57) ABSTRACT

A semiconductor device is provided with: a semiconductor element; and a connecting conductor that electrically connects at least one of an input terminal and an output terminal of the semiconductor element to a connection terminal of an electronic device. In this semiconductor device, the connecting conductor is a block structure.

9 Claims, 7 Drawing Sheets

(56) References Cited

U.S. PATENT DOCUMENTS

| | | | |
|---|---|---|---|
| 8,243,451 B2* | 8/2012 | Dede et al. | 361/702 |
| 8,279,605 B2* | 10/2012 | Kawanami et al. | 361/704 |
| 8,391,008 B2* | 3/2013 | Dede | 361/702 |
| 8,411,441 B2* | 4/2013 | Nakatsu et al. | 361/699 |
| 8,446,726 B2* | 5/2013 | Schloerke et al. | 361/704 |
| 2004/0070060 A1* | 4/2004 | Mamitsu et al. | 257/680 |
| 2004/0144996 A1* | 7/2004 | Inoue | 257/200 |
| 2005/0006963 A1* | 1/2005 | Takenaka et al. | 310/52 |
| 2006/0120047 A1* | 6/2006 | Inoue | 361/699 |
| 2007/0253164 A1* | 11/2007 | Matsuo et al. | 361/699 |
| 2008/0224303 A1* | 9/2008 | Funakoshi et al. | 257/701 |
| 2008/0224553 A1* | 9/2008 | Abe et al. | 310/71 |
| 2009/0079061 A1* | 3/2009 | Mallik et al. | 257/712 |
| 2009/0107655 A1* | 4/2009 | Kajiura | 165/80.3 |
| 2010/0025126 A1* | 2/2010 | Nakatsu et al. | 180/65.1 |
| 2010/0188814 A1* | 7/2010 | Nakatsu et al. | 361/689 |
| 2010/0276799 A1* | 11/2010 | Heng et al. | 257/704 |
| 2011/0037166 A1* | 2/2011 | Ikeda et al. | 257/712 |
| 2011/0057713 A1* | 3/2011 | Kawanami et al. | 327/427 |
| 2011/0235270 A1* | 9/2011 | Nakatsu et al. | 361/689 |
| 2011/0249421 A1* | 10/2011 | Matsuo et al. | 361/821 |
| 2011/0310585 A1* | 12/2011 | Suwa et al. | 361/820 |
| 2012/0187555 A1* | 7/2012 | Ong et al. | 257/693 |
| 2013/0062751 A1* | 3/2013 | Takagi et al. | 257/692 |
| 2013/0087904 A1* | 4/2013 | Clark et al. | 257/706 |
| 2013/0094165 A1* | 4/2013 | Yano et al. | 361/784 |
| 2013/0099377 A1* | 4/2013 | Yu et al. | 257/737 |
| 2013/0146339 A1* | 6/2013 | Yano et al. | 174/255 |
| 2013/0147012 A1* | 6/2013 | McLellan et al. | 257/532 |
| 2013/0147026 A1* | 6/2013 | Topacio et al. | 257/698 |
| 2013/0154081 A1* | 6/2013 | Kadoguchi et al. | 257/712 |
| 2013/0265724 A1* | 10/2013 | Kaneko et al. | 361/715 |
| 2013/0279114 A1* | 10/2013 | Nishikimi et al. | 361/699 |
| 2014/0098588 A1* | 4/2014 | Kaneko et al. | 363/141 |

FOREIGN PATENT DOCUMENTS

| | | |
|---|---|---|
| JP | 2002-124313 A | 4/2002 |
| JP | 2008-177324 A | 7/2008 |
| JP | 2008-259398 A | 10/2008 |
| JP | 2009-238831 A | 10/2009 |
| JP | 2010-16926 A | 1/2010 |
| JP | 4935735 B2 | 5/2012 |
| JP | 5231880 B2 | 3/2013 |

OTHER PUBLICATIONS

Notice of Reasons of Rejection dated Feb. 10, 2015, issued in Japanese Application No. 2011-210651, w/English translation. (6 pages).

* cited by examiner

SEMICONDUCTOR DEVICE

BACKGROUND OF THE INVENTION

The present invention relates to a semiconductor device, and more particularly relates to a semiconductor device that includes a semiconductor module having a semiconductor element and supplies drive power to an electric motor.

In recent years, electric vehicles provided with an electric motor as its driving power source are becoming popular. Electric vehicles are provided with a semiconductor device such as a PEU (Power Electronic Unit) that converts direct-current power supplied from a battery into alternating-current power and controls the supply of the power to the electric motor, and also according to need, performs a control such that alternating-current power generated by a regenerative mechanism is converted into direct-current power and the power is accumulated in a battery such at a time of braking, for example.

The power electronic unit is provided with a power module that converts direct-current power supplied from the battery into alternating-current power, and also according to need, converts the alternating-current power generated by the regenerative mechanism into direct-current power. Because such power modules are often used in plural, while positioning a plurality of power modules relatively close to each other, an electric wire electrically connecting the plurality of power modules with each other, and an electric wire electrically connecting the plurality of power modules with other constituent members and external devices, are routed near the power modules. Furthermore, in the power modules, because a relatively high electric current is used, power semiconductor elements such as a Power MOSFET (Metal Oxide Semiconductor Field Effect Transistor) or an IGBT (Insulated Gate Bipolar Transistor) are often incorporated as a switching element. Because the operations of such power semiconductor elements are accompanied by the generation of a large amount of heat, heat sinks are mounted on power modules in order to secure a radiation route.

Japanese Patent Application Laid-open Publication No. 2008-259398 relates to a power conversion device, and discloses a configuration in which a semiconductor module is fixed to a base board, and a conduction bus bar that provides conduction between the semiconductor module and the exterior of the device is positioned above the semiconductor module while being included in an input-side terminal board. In this power conversion device, the semiconductor module has a configuration in which a semiconductor chip is molded by resin, and the base board functions as a heat sink.

SUMMARY OF THE INVENTION

However, according to studies of the present inventors, with the configuration disclosed in Japanese Patent Application Laid-open Publication No. 2008-259398, by the positioning of the conduction bus bar that provides conduction between the semiconductor module and the exterior of the device above the semiconductor module while being included in the input-side terminal board, to position the conduction bus bar three-dimensionally above the semiconductor module, although high-densification of the wiring structure is made possible with the wiring arranged on a small installation area, the input-side terminal board needs to include a conduction bus bar in any case, so that the terminal board needs to be made of resin as well as being separately installed as a required constituent member. Additionally, because the terminal board needs to provide conduction with the exterior of the device, screw taps, in order to fasten terminals of electric wiring from the exterior of the device, needs to be integrally formed in its inner portion, thereby complicating the configuration.

According to further studies of the present inventors, particularly, in view of omitting an additional terminal board, it is preferable that the connecting conductor that connects output terminals of the semiconductor module to input terminals of external devices such as an electric motor or condenser has a configuration such that, while exhibiting excellent mechanical properties and electrical properties, mechanically supports and electrically connects these terminals. In this regard, the desirable mechanical properties of the connecting conductor have strength to mechanically fasten and support these terminals, and strength to reinforce the case. The desirable electrical properties of the connecting conductor include an excellent conductivity obtained without unnecessarily increasing the inductance. Additionally, the desirable properties of the connecting conductor are those such as its size that allows for forming of fastening holes, such as screw holes, for fastening these terminals, and radiation that prevents unnecessary accumulation of heat. In this regard, although Japanese Patent Application Laid-open Publication No. 2008-259398 discloses a configuration in which the conduction bus bar that provides conduction between the semiconductor module and the exterior of the device is positioned above the semiconductor module while being included in the input-side terminal board, there is no suggestion about a specific configuration in which the connecting conductors, that connect output terminals of semiconductor modules to input terminals of external devices, exhibit excellent mechanical properties and electrical properties in order to omit an additional terminal board.

The present invention has been achieved in view of the above studies, and an object of the present invention is to provide a semiconductor device capable of mechanically fastening, supporting, and also electrically connecting an output terminal of a semiconductor element to an input terminal of an external device, and an input terminal of a semiconductor element to a connection terminal of a related device, while omitting an additional terminal board.

To achieve the above object, a first aspect of the present invention provides a semiconductor device comprising: a semiconductor element; and a connecting conductor that electrically connects at least one of an input terminal and an output terminal of the semiconductor element to a connection terminal of an electronic device. In this aspect, the connecting conductor is a block structure.

In a second aspect of the present invention, in addition to the first aspect, the connecting conductor is the block structure that electrically connects an output terminal of the semiconductor element to a connection terminal of an external device.

In a third aspect of the present invention, in addition to the second aspect, the semiconductor device further comprises: a resin case that accommodates the semiconductor element. In this aspect, the connecting conductor is integrally formed with the case and fixed to the case.

In a fourth aspect of the present invention, in addition to the second or third aspect, the connecting conductor includes a screw fastening unit that fastens the output terminal or the connection terminal.

In a fifth aspect of the present invention, in addition to any one of the second to fourth aspects, the connecting conductor is made of an aluminum material.

A sixth aspect of the present invention, in addition to the first aspect, further comprises: a condenser that is electrically connected to the semiconductor element. In this aspect, the connecting conductor includes a plurality of connecting conductors, and the plurality of connecting conductors electrically connect an input terminal of the semiconductor element to a connection terminal of the condenser.

In a seventh aspect of the present invention, in addition to the sixth aspect, the plurality of connecting conductors include a first connecting conductor and a second connecting conductor that is arranged to deviate from the first connecting conductor.

In an eighth aspect of the present invention, in addition to the sixth or seventh aspect, each of the plurality of connecting conductors includes a screw fastening unit that fastens the input terminal or the connection terminal.

In a ninth aspect of the present invention, in addition to any one of the sixth to eighth aspects, the plurality of connecting conductors are made of an aluminum material.

The semiconductor device according to the first aspect of the present invention includes a connecting conductor that electrically connects at least one of an input terminal and an output terminal of a semiconductor element to a connection terminal of an electronic device, wherein because the connecting conductor is a block structure, while omitting an additional terminal board, it is possible to mechanically fasten, support, and also electrically connect at least one of the input terminal and the output terminal of the semiconductor element to the connection terminal of the electronic device.

The semiconductor device according to the second aspect of the present invention includes a connecting conductor that electrically connects an output terminal of the semiconductor element to a connection terminal of an external device, wherein because the connecting conductor is a block structure, while omitting an additional terminal board, it is possible to mechanically fasten, support, and also electrically connect the output terminal of the semiconductor element to an input terminal of the external device.

The semiconductor device according to the third aspect of the present invention further includes a resin case that accommodates the semiconductor element, wherein because the connecting conductor is integrally formed with the case and fixed to the case, while reinforcing the case and improving its rigidness, it is possible to mechanically fasten, support, and also electrically connect the output terminal of the semiconductor element to an input terminal of an external device.

In the semiconductor device according to the fourth aspect of the present invention, because a screw fastening unit that fastens the output terminal or the connection terminal is arranged on the connecting conductor, the output terminal of the semiconductor element and an input terminal of an external device can be mechanically and securely supported and can be electrically and securely connected with a simple configuration.

In the semiconductor device according to the fifth aspect of the present invention, because the connecting conductor is made of an aluminum material, while balancing various properties of the connecting conductor such as mechanical properties, electrical properties, and the size thereof, it is possible to mechanically and securely support and electrically and securely connect the output terminal of the semiconductor module to an input terminal of an external device.

The semiconductor device according to the sixth aspect of the present invention includes a plurality of connecting conductors that electrically connect the input terminal of the semiconductor element to the connection terminal of the condenser, wherein because each of the plurality of connecting conductors is a block structure, while omitting an additional terminal board, it is possible to mechanically fasten, support, and also electrically connect the input terminal of the semiconductor element to a connection terminal of a related device.

In the semiconductor device according to the seventh aspect of the present invention, because the plurality of connecting conductors including a first connecting conductor and a second connecting conductor that is arranged to deviate from the first connecting conductor, while omitting an additional terminal board, when mechanically fastening, supporting, and also electrically connecting the input terminal of the semiconductor element to a connection terminal of a related device, one of connecting conductors is capable of being positioned not to interfere with a fastening tool of another connecting conductor or the like, and without using any special tools or fastening sequence, it is capable of mechanically fastening, supporting, and also electrically connecting the input terminal of the semiconductor element to the connection terminal of the related device.

In the semiconductor device according to the eighth aspect of the present invention, because a screw fastening unit that fastens an input terminal or a connection terminal is provided on each of the plurality of connecting conductors, the input terminal of the semiconductor element and a connection terminal of a related device can be mechanically and securely fastened and supported and can be electrically and securely connected with a simple configuration.

In the semiconductor device according to the ninth aspect of the present invention, because the plurality of connecting conductors are made of an aluminum alloy, while balancing various properties of the connecting conductor such as mechanical properties, electrical properties, and the size thereof, it is possible to mechanically and securely fasten and support and to electrically and securely connect the input terminal of the semiconductor element to a connection terminal of a related device.

DETAILED DESCRIPTION OF THE PREFERRED EMBODIMENTS

Figure 1:
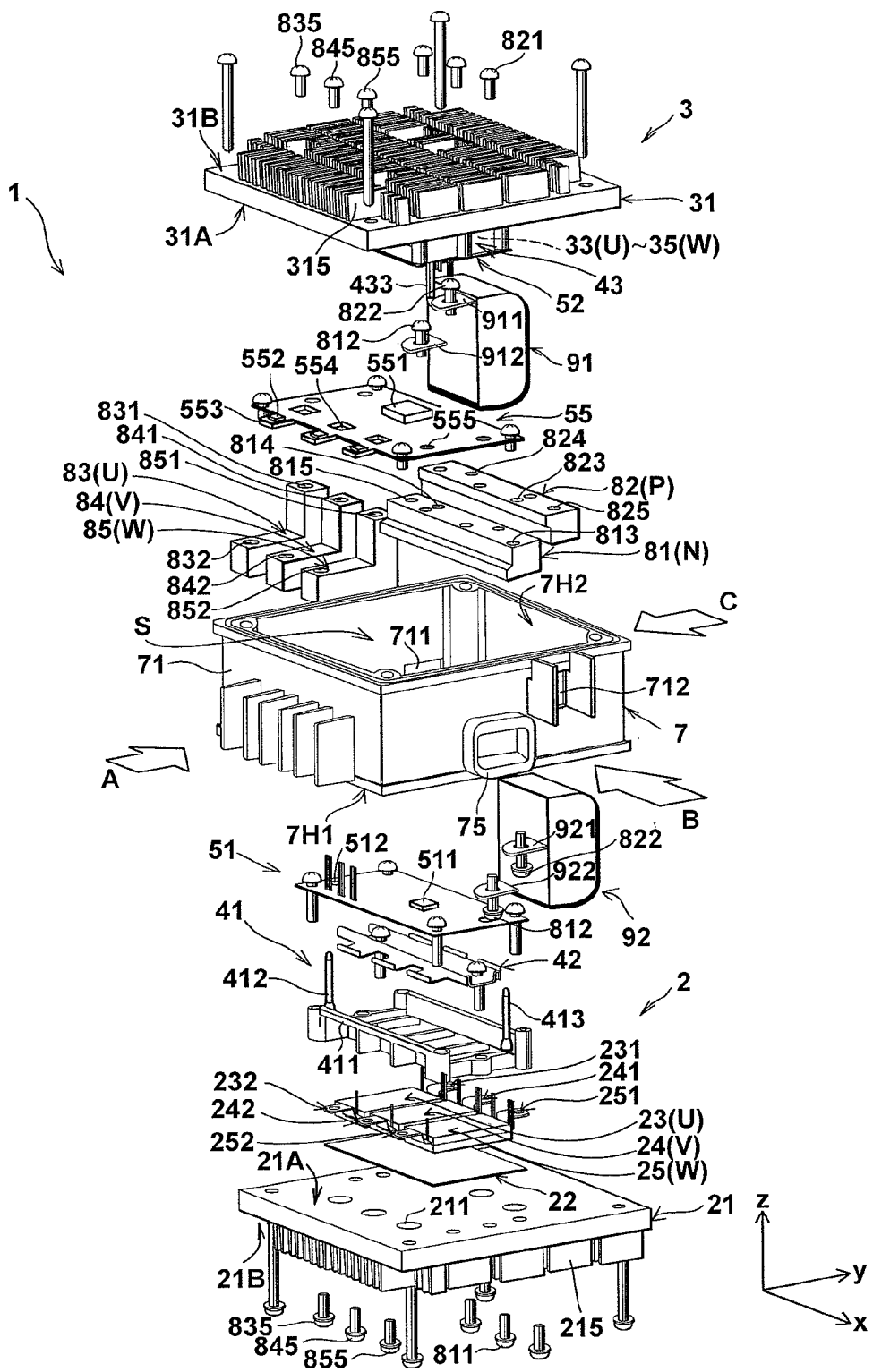
FIG. 1 is an exploded perspective view showing a power electronic unit according to a first embodiment of the present invention, in a state where one of its power modules is assembled.

Preferred embodiments of a semiconductor device according to the present invention will be explained below in detail with reference to the drawings as needed, while taking a power electronic unit as an example. In the drawings, the x-axis, the y-axis, and the z-axis form a three-axis orthogonal coordinate system, where the z-axis extends in a vertical direction, and the x-y plane extends horizontally.

[Configuration of Control System]

A configuration of a control system to which a power electronic unit serving as a semiconductor device according to the present embodiment is applied is explained first in detail.

Typically, a power electronic unit 1 according to the present embodiment shown in FIG. 1 to FIG. 4 incorporates, although not shown, an electric motor that is a driving power source and a battery that is a secondary cell, and the power electronic unit 1 is incorporated in an electric car provided with a regenerative mechanism which generates regenerative power at a time of deceleration.

The power electronic unit 1, in an electric vehicle, each individually, or under the control of a control device (not shown) that controls overall the electric motor, the battery, and the regenerative mechanism, is capable of controlling the supply of drive power from the battery to the electric motor, as well as being capable of controlling the supply of regenerative power from the regenerative mechanism to the battery. For example, when using a three-phase alternating current as the drive current of the electric motor, the power electronic unit 1 has a function of a DC/AC converter that steadily converts the direct current supplied from the battery into a three-phase alternating current consisting of a U-phase, a V-phase, and a W-phase and supplies this alternating current to the electric motor, along with a function of an AC/DC converter that steadily converts the regenerative alternating current generated by the regenerative mechanism into a direct current and supplies this direct current to the battery. Furthermore, according to need, the power electronic unit 1 may only have a DC/AC converter function of steadily converting the direct current supplied from the battery into an alternating current, and supplies this alternating current to the electric motor.

The electric motor, for example, is a three-phase brushless electric motor that operates with a three-phase alternating power supply, and supplies the drive power that drives the electric vehicle.

The battery is a typical nickel-metal-hydride type or lithium-ion type secondary cell, and while supplying the electric motor and other assisting devices with required power, stores the regenerative power generated from the regenerative mechanism.

Furthermore, the power electronic unit 1 can be applied to a hybrid vehicle that incorporates an engine such as an internal-combustion engine in addition to the electric motor, or a fuel cell vehicle that incorporates a fuel cell. In a case where the power electronic unit 1 is applied to a hybrid vehicle, the power electronic unit 1 is capable of controlling the supply of drive power from the battery to the electric motor, as well as controlling the supply of regenerative power from the regenerative mechanism to the battery and the supply of generated power from the generator as an assisting device of the engine to the battery. Furthermore, in a case where the power electronic unit 1 is applied to a fuel cell vehicle, the power electronic unit 1 is capable of controlling the supply of drive power from the fuel cell to the electric motor, as well as controlling the supply of regenerative power from the regenerative mechanism to the battery. Further, in a case where the power electronic unit 1 is applied to either one of an electric vehicle, a hybrid vehicle, or a fuel cell vehicle, the power electronic unit 1 is, according to need, capable of controlling the supply of regenerative power from the electric motor to the battery such as at a time of braking.

[Overall Configuration of Power Electronic Unit]

Next, as an example, the overall configuration of the power electronic unit 1 according to the present embodiment, in a case where mainly the direct current from the battery is converted to a three-phase alternating current and supplied to the electric motor, is explained in detail.

As shown in FIG. 1 to FIG. 4, the power electronic unit 1 is mainly provided with a first semiconductor module 2 with first semiconductor elements 23(U), 24(V), and 25(W) having switching functions, positioned adjacent to each other in the x-axis direction and mounted on a surface 21A which is the inner-side surface of a first cooling member 21, a second semiconductor module 3 with second semiconductor elements 33(U), 34(V), and 35(W) having switching functions, positioned adjacent to each other in the x-axis direction and mounted on a surface 31A which is the inner-side surface of a second cooling member 31, a case 7 having a sidewall 71 which extends in the vertical direction and is typically rectangular cylindrical, and while forming an internal space S surrounded by the sidewall 71, has a first opening 7H1 and a second opening 7H2, formed on opposite sides of each other on the sidewall 71 at both ends in the vertical direction, which open the internal space S to the outer area, and a circuit board 55 that is typically of a flat rectangular shape and is a control circuit board mounted with a controlling IC (Integrated Circuit) 551 that controls the switching operations of the first semiconductor elements 23(U) to 25(W) and the second semiconductor elements 33(U) to 35(W). These constituent members are, in the vertical direction, substantially layered along the same axis.

In the power electronic unit 1, the first semiconductor elements 23(U) to 25(W) are accommodated in the case 7 as to be inserted into the internal space S of the case 7 through the first opening 7H1 of the case 7, and by adjoining one side of the first cooling member 21, the surface 21A, with the bottom end of the case 7 while exposing a surface 21B which is the other outer-side surface of the first cooling member 21 to outside of the case 7, the first semiconductor module 2 is mounted in the case 7 in a state where the first opening 7H1 is closed by the first cooling member 21.

Similarly, in the power electronic unit 1, the second semiconductor elements 33(U) to 35(W) are accommodated in the case 7 as to be inserted into the internal space S of the case 7 through the second opening 7H2 of the case 7, and by adjoining one side of the second cooling member 31, the surface 31A, with the upper end of the case 7 while exposing a surface 31B which is the other outer-side surface of the first cooling member 31 to outside of the case 7, the second semiconductor module 3 is mounted in the case 7 in a state where the second opening 7H2 is closed by the second cooling member 31.

The circuit board 55, typically a PCB (Printed Circuit Board), while being electrically connected to each printed wiring, is mounted with, in addition to the controlling IC 551, various devices such as a resistor device (not shown), or a condenser on the front surface (the upper-side surface), along with being a control circuit board on which a total of three current sensors 552, corresponding to the front surfaces of a total of three protruding portions 553, are mounted on. The controlling IC 551 performs the controlling of the switching operations of the first semiconductor elements 23(U) to 25(W) and the second semiconductor elements 33(U) to 35(W). Furthermore, each of the current sensors 552 is a non-contact type current sensor, typically a coreless current sensor having a Hall element, and individually, for the U-phase alternating current, the V-phase alternating current, and the W-phase alternating current, detects corresponding magnetic fields generated and converts these currents to current signals.

This circuit board 55, within the internal space S of the case 7, in between the first semiconductor module 2 and the second semiconductor module 3, in such a manner that each of the first semiconductor elements 23(U) to 25(W) thereof and the second semiconductor elements 33(U) to 35(W) thereof are appropriately separated, is mounted in the case 7 to be parallel with the horizontal surface.

Specifically, the circuit board 55, in between the first opening 7H1 and the second opening 7H2 of the case 7, in such a manner that the rear surface (the lower-side surface) thereof is opposite to one side of the first cooling member 21, the surface 21A, and the front surface thereof is opposite to one side of the second cooling member 31, the surface 31A, is positioned and mounted in parallel in the vertical direction in relation to the first cooling member 21 and the second cooling member 31. With such a configuration, the circuit board 55, while efficiently using the internal space S, is arranged with appropriate spacing of required distances from the first semiconductor elements 23(U) to 25(W) and the second semiconductor elements 33(U) to 35(W). Due to this, the circuit board 55, the controlling IC 551, and its control current paths can be distanced from the first semiconductor elements 23(U) to 25(W) and the second semiconductor elements 33(U) to 35(W) themselves and current paths where relatively high currents flow upon their operation, reducing the effects of excess heat and electromagnetic waves on the circuit board 55, for example, and improving the durability of these members.

When the circuit board 55 is at a midpoint between the first opening 7H1 and the second opening 7H2 of the case 7, or the circuit board 55 is positioned at a midpoint between the first semiconductor module 2 and the second semiconductor module 3, while appropriately balancing distancing of the circuit board 55 from the first semiconductor elements 23(U) to 25(W) and the second semiconductor elements 33(U) to 35(W), the entire configuration of the power electronic unit 1 can be made more compact, and is further preferable.

Furthermore, the power electronic unit 1 is provided with, all of which are mounted in the case 7, one first connecting conductor 81(N), one second connecting conductor 82(P), and a total of three third connecting conductors 83(U), 84(V), and 85(W).

The first connecting conductor 81(N) and the second connecting conductor 82(P), when supplying power to the electric motor, function as a power input wire when connected electrically to the battery and power is supplied from the battery. Specifically, the first connecting conductor 81(N) is electrically connected to a minus terminal of the battery, and the second connecting conductor 82(P) is electrically connected to a plus terminal of the battery. Furthermore, when charging the battery, the first connecting conductor 81(N) and the second connecting conductor 82(P) function as an output wire.

The third connecting conductors 83(U), 84(V), and 85(W), when electrically connected to the electric motor and supplying power to the electric motor, function as an output wire for the three-phase alternating current. Specifically, the third connecting conductor 83(U) is electrically connected to the U-phase drive current input terminal of the electric motor, the third connecting conductor 84(V) is electrically connected to the V-phase drive current input terminal of the electric motor, and the third connecting conductor 85(W) is electrically connected to the W-phase drive current input terminal of the electric motor. Furthermore, when regenerative power is input from the regenerative mechanism, the third connecting conductors 83(U), 84(V), and 85(W) function as an input wire.

Furthermore, the power electronic unit 1 includes a total of two condensers, namely a first condenser 91 and a second condenser 92, which are mounted in the case 7 and accommodated in the internal space S. The first condenser 91 has connection terminals 911 and 912, and the second condenser 92 has connection terminals 921 and 922. That is, the first condenser 91 and the second condenser 92 have an identical configuration to each other including its electrostatic capacity and shape, except for the arrangement position of the connection terminals 921 and 922 and the arrangement position of the connection terminals 911 and 912 being different in the vertical direction.

Each of the first condenser 91 and the second condenser 92 is electrically connected in parallel with each other between the first connecting conductor 81(N) and the second connecting conductor 82(P), along with being electrically connected in parallel with respect to the first semiconductor elements 23(U) to 25(W) and the second semiconductor elements 33(U) to 35(W), and when supplying power to the electric motor, function as smoothing condensers that smooth the direct current from the battery. Furthermore, when charging the battery, the first condenser 91 and the second condenser 92 function as smoothing condensers that smooth the direct current from the first semiconductor elements 23(U) to 25(W) and the second semiconductor elements 33(U) to 35(W). Furthermore, according to need, the first condenser 91 and the second condenser 92 may be unified and a single condenser may be used, or the number of condensers may be increased and three or more condensers may be used.

As described above, with the power electronic unit 1, where on both the top and bottom ends of the cylindrical case 7, the first semiconductor module 2 and the second semiconductor module 3 are mounted correspondingly to each other, and a layered structure where the circuit board 55 is positioned in between the first semiconductor module 2 and the second semiconductor module 3 in the internal space S of the case 7 is used, and the third connecting conductors 83(U), 84(V), and 85(W) are used, while downsizing by making compact the configuration of the entire device through efficient use of the internal space S, the U-phase drive current input terminal of the electric motor is electrically connected to the third connecting conductor 83(U), the V-phase drive current input terminal of the electric motor is electrically connected to the third connecting conductor 84(V), and the W-phase drive current input terminal of the electric motor is electrically connected to the third connecting conductor 85(W).

In addition, in the power electronic unit 1, as the first connecting conductor 81(N) and the second connecting conductor 82(P) are used, while downsizing by making compact the configuration of the entire device through efficient use of the internal space S, the minus terminal of the battery is electrically connected to the first connecting conductor 81(N), the plus terminal of the battery is electrically connected to the second connecting conductor 82(P), while meanwhile, the first condenser 91 and the second condenser 92 are each electrically connected in a parallel manner with each other between the first connecting conductor 81(N) and the second connecting conductor 82(P), along with being electrically connected in a parallel manner in relation to the first semiconductor elements 23(U) to 25(W) and the second semiconductor elements 33(U) to 35(W).

Respective constituent elements of the power electronic unit 1 are explained below in detail.

[Configuration Related to Semiconductor Module]

As shown in FIG. 1 to FIG. 4, the first semiconductor module 2 is provided with the first cooling member 21, the first semiconductor elements 23(U), 24(V), and 25(W), and additionally provided with a frame 41, a pressing member 42, and a circuit board 51.

The first cooling member 21 that is typically made of an aluminum alloy and fixed to the case 7 has a function of a heat sink that acquires heat generated by the operations of the first semiconductor elements 23(U) to 25(W) and releases this to the outer side, that of a mounting member on which the first semiconductor elements 23(U) to 25(W) are mounted on, and that of a lid that closes the first opening 7H1 of the case 7, while being a part of the structural body of the power electronic unit 1.

One side of the first cooling member 21, the surface 21A, is configured as a flat plane having no differences in level, and on the other side, the surface 21B, on the opposite side, a plurality of radiation fins 215 for increasing the radiation efficiency are arranged in a systematically lined shape. On the first cooling member 21, penetration holes 211 for attachments of sorts and fastening holes having female screw threads are arranged, and it is preferable that these are closed by plugs (not shown) according to need, to prevent entry of water and dust. The size of the first cooling member 21 in the horizontal direction is larger than the individual sizes of the first semiconductor module 2, the second semiconductor module 3, and the circuit board 55 in the horizontal direction.

The first semiconductor element 23(U) of the first semiconductor module 2 has a low-side switching function of generating, among the three-phase alternating current, the U-phase low voltage side alternating current. The first semiconductor element 23(U) is provided with a semiconductor chip (not shown), a sealing body (for which reference numeral is not assigned), which is a package that seals the semiconductor chip, a first power input terminal 231 which is a board shape extending from one end (the end in the positive y-axis direction) of the sealing body in a shape of a gull-wing, a first output terminal 232 which is a board shape extending from the other end (the end in the negative y-axis direction) of the sealing body in the shape of a gull-wing, and connection leads (for which reference numeral is not assigned), which extend upward from one end and the other end of the sealing body.

As for the semiconductor chip, a power semiconductor element, such as an IGBT or a Power MOSFET having a high-voltage characteristic, is used. For the sealing body, typically a resin sealing body such as an epoxy resin sealing body is used. The inner side of the first power input terminal 231 is electrically connected to the input terminal of the semiconductor chip within the sealing body, and the outer side of the first power input terminal 231 is electrically connected to the first connecting conductor 81(N). The inner side of the first output terminal 232 is electrically connected to the output terminal of the semiconductor chip within the sealing body, and the outer side of the first output terminal 232 is electrically connected to the third connecting conductor 83(U).

As for the first semiconductor module 2, as the other first semiconductor element 24(V) and first semiconductor element 25(W) have a configuration identical to the first semiconductor element 23(U), explanations of identical configurations are abbreviated or omitted for convenience. Specifically, for the first semiconductor element 24(V) and the first semiconductor element 25(W), a product of the same type as the first semiconductor element 23(U), typically a product of the same model number, is used, and the first semiconductor elements 23(U) to 25(W) are interchangeable.

That is, the first semiconductor element 24(V) has a low-side switching function of generating, among the three-phase alternating current, the V-phase low voltage side alternating current, and similarly to the first semiconductor element 23(U), is provided with a first power input terminal 241, a first power output terminal 242 and the like, which are electrically connected correspondingly to the first connecting conductor 81(N), the third connecting conductor 84(V) and the like. Furthermore, the first semiconductor element 25(W) has a low-side switching function of generating, among the three-phase alternating current, the W-phase low voltage side alternating current, and similarly to the first semiconductor element 23(U), is provided with a first power input terminal 251, a first power output terminal 252 and the like, which are electrically connected correspondingly to the first connecting conductor 81(N), the third connecting conductor 85(W) and the like. Furthermore, according to need, the first semiconductor elements 23(U) to 25(W) may be unified, and a single semiconductor element may be used.

Figure 3:
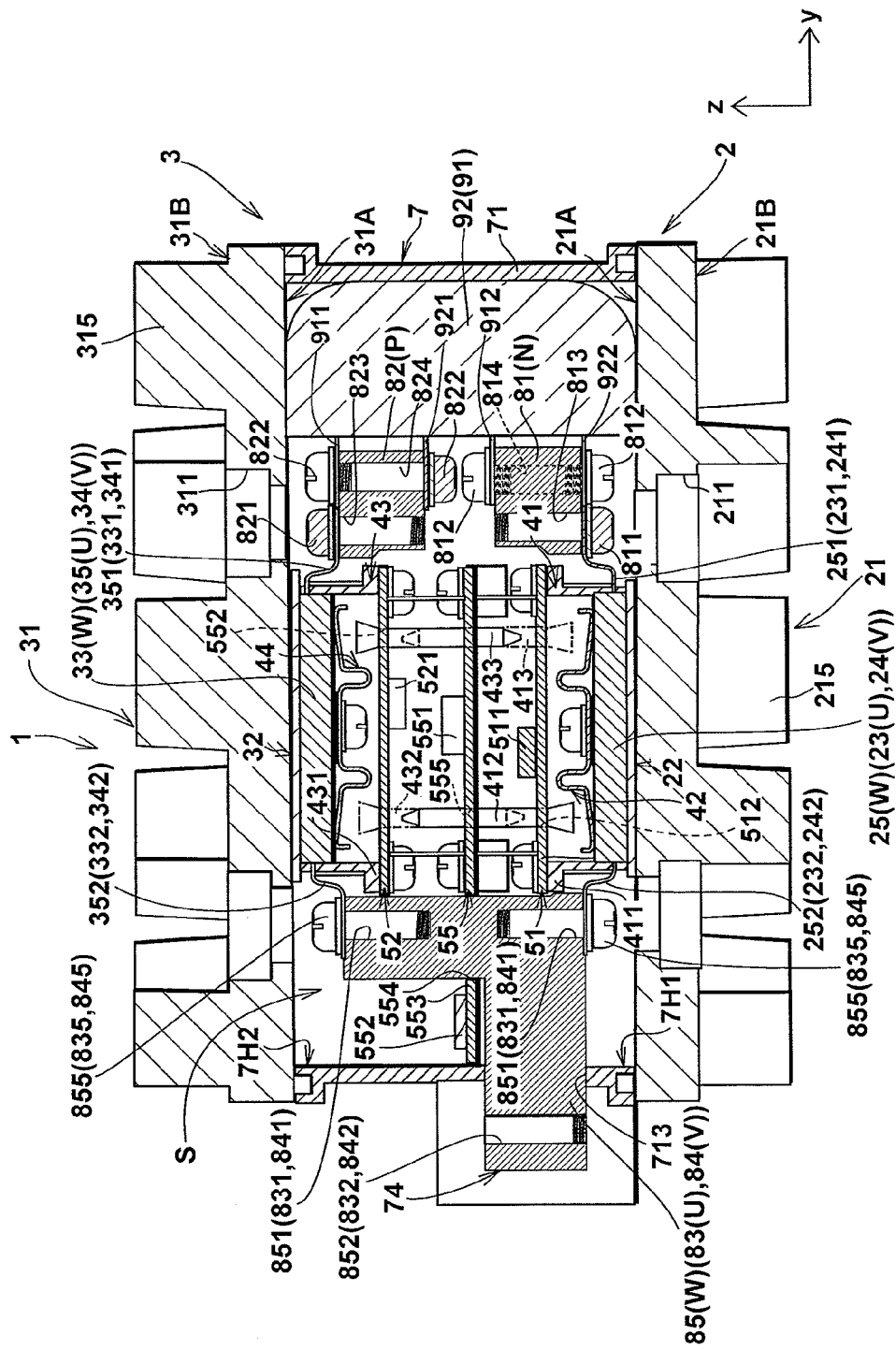
FIG. 3 is an enlarged detailed cross-sectional view showing the power electronic unit according to the first embodiment cut along a cross-sectional line S3-S3 in FIG. 2A and FIG. 2C, where for each fastening member in FIG. 3 only heads thereof are shown for convenience.
Figure 4:
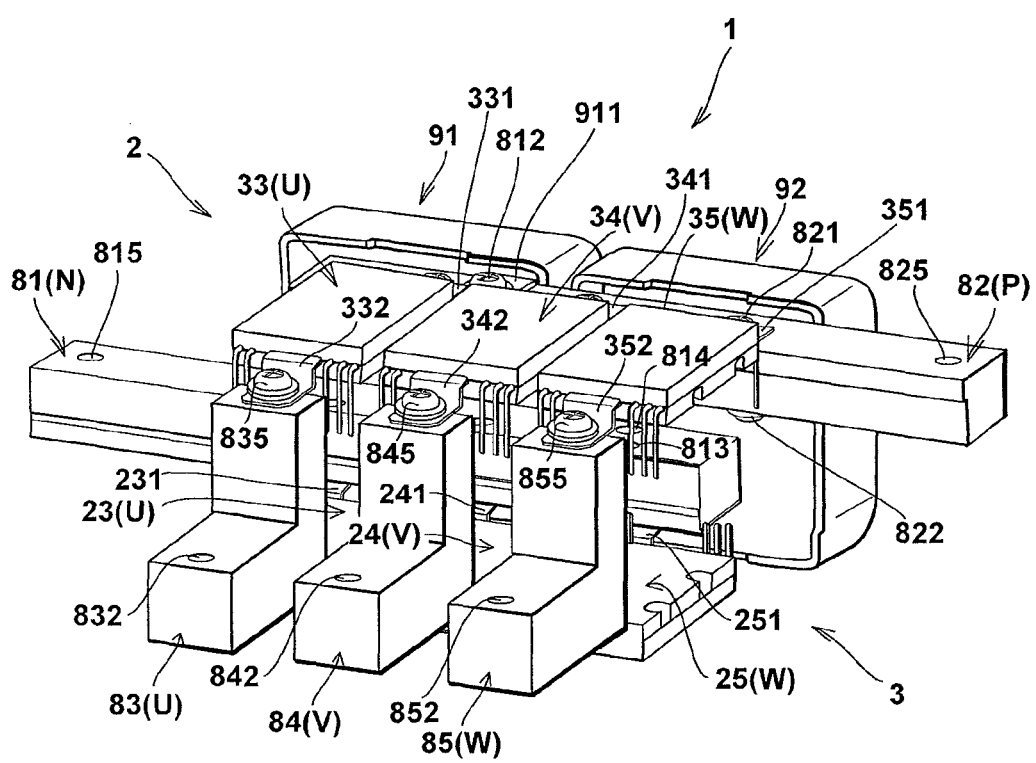
FIG. 4 is an enlarged perspective view of related portions of an output connecting conductor of the power electronic unit according to the first embodiment.
Figure 4:
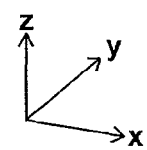

As shown particularly in FIG. 1, FIG. 3, and FIG. 4, the three first semiconductor elements 23(U) to 25(W) are attached to the frame 41, and in this state of being attached to the frame 41, are mounted on one side of the first cooling member 21, the surface 21A. The frame 41 is provided with a frame body 411, and a total of two positioning pins 412 and 413 arranged upright on the frame body 411. Furthermore, in FIG. 3, because the positioning pin 413 is in front on the viewing side, this is shown by an imaginary dashed line.

The frame body 411, while maintaining the positioning of the first semiconductor elements 23(U) to 25(W) adjacently arranged in the x-axis direction parallel to the horizontal surface, positions the first power input terminals 231 to 251 to be parallel to each other and aligned in the x-axis direction, and positions the first output terminals 232 to 252 to each correspond, at the opposite side, with the first power input terminals 231 to 251 by being parallel to each other and aligned in the x-axis direction. For the frame body 411, typically an injection molded resin frame body is used. The positioning pins 412 and 413 are typically integrally formed with the frame body 411 and extend in the vertical direction. Furthermore, the frame body 411 and positioning pin 412 and 413 may be made of metal if an increase of weight is allowed, and these elements may be separated if complication of the configuration is allowed.

As shown particularly in FIG. 1 and FIG. 3, on the frame body 411 of the frame 41, a pressing member 42 is fixed and attached. The pressing member 42, while pressing the first semiconductor elements 23(U) to 25(W) onto the frame body 411 with an appropriate pressure, interposes the first semiconductor elements 23(U) to 25(W) between the frame body 411 and one side of the first cooling member 21, the surface 21A. The pressing member 42 is fixed onto the frame body 411 using a fastening member such as screws (for which reference numeral is not assigned). The pressing member 42 is typically made of a metal material such as stainless steel having elasticity and superior in workability of such as machine processing. On the pressing member 42, there is arranged a rib having a U-shaped cross-section for assigning a desired spring constant, for example, between a portion that is attached to the frame body 411 and a portion pressing the first semiconductor elements 23(U) to 25(W).

As shown particularly in FIG. 1 and FIG. 3, the frame 41, in a state where the first semiconductor elements 23(U) though 25(W) are in contact with an insulation sheet 22 mounted on one side of the first cooling member 21, the surface 21A, sharing a fastening member such as screws (for which reference numeral is not assigned), for the pressing member 42 or circuit board 51, is fixed onto one side of the first cooling member 21, the surface 21A. The insulation sheet 22, while acting as a secure electronic insulation between the first cooling member 21 and the first semiconductor elements 23(U) to 25(W), has heat conductivity capable of efficiently conducting the heat generated by the operations of the first semiconductor elements 23(U) to 25(W) to the first cooling member 21. For the insulation sheet 22, typically a silicone rubber sheet is used.

As shown particularly in FIG. 1 and FIG. 3, the circuit board 51 is, typically of a flat rectangular shape, and within the internal space S of the case 7, mounted in the case 7 between the first semiconductor elements 23(U) to 25(W) and the circuit board 55. The circuit board 51 is a drive circuit board implemented with a driving IC 511 that drives and operates the switching of the first semiconductor elements 23(U) to 25(W), based on control signals transmitted from the controlling IC 551 of the circuit board 55 for controlling the switching operations of the first semiconductor elements 23(U) to 25(W). Furthermore, the driving IC 511 may be divided into a plurality of driving ICs that individually drive the first semiconductor elements 23(U) to 25(W).

Specifically, the circuit board 51 has a pair of positioning holes 512 that conform to the positioning pins 412 and 413 of the frame 41, and while being positioned on the frame 41 by insertion of the positioning pins 412 and 413 through the corresponding positioning holes 512, the circuit board 51 is mounted parallel to the horizontal surface onto the frame 41 using a fastening member such as screws (for which reference numeral is not assigned). At this time, the rear surface of the circuit board 55 and the front surface (the upper-side surface) of the circuit board 51 are parallel to and opposite to each other.

The circuit board 51, typically a PCB, while being electrically connected to each printed wiring, is mounted with, in addition to the driving IC 511, various devices such as a resistor device (not shown), or a condenser on the front surface, and has connection leads (for which reference numeral is not assigned), which extend upwards from the wiring board and are given the shape of a kink. The circuit board 51 electrically connects these connection leads to the circuit board 55 through connectors (not shown) mounted on the front surface of the circuit board 55, and also gets electrically connected to the connection leads of the first semiconductor elements 23(U) to 25(W). That is, the circuit board 51, through its connection leads, receives control signals transmitted from the controlling IC 551 of the circuit board 55, and by transmitting drive signals from the driving IC 511, that operates based on the control signals, to the first semiconductor elements 23(U) to 25(W), through the connection leads of the first semiconductor elements 23(U) to 25(W), operates the switching of the first semiconductor elements 23(U) to 25(W).

Meanwhile, as shown in FIG. 1 to FIG. 4, although the second semiconductor module 3 is attached at a position higher than the first semiconductor module 2 and in an upside-down manner as compared to the first semiconductor module 2, and its usage differs from the first semiconductor module 2, as it has a configuration identical to the first semiconductor module 2, explanations of identical configurations are abbreviated or omitted for convenience. Specifically, the second semiconductor module 3 is provided with a second cooling member 31, second semiconductor elements 33(U), 34(V), and 35(W), as well as being provided with such as a frame 43, a pressing member 44, and a circuit board 52.

That is, the second cooling member 31 has a configuration identical to that of the first cooling member 21, and similarly to the first cooling member 21, has a surface 31A on one side which is a flat plane, a surface 31B on the other side where a radiation fin 315 is arranged, and penetration holes 311. Furthermore, while having a configuration identical to that of the first semiconductor element 23(U), the second semiconductor element 33(U) has a high-side switching function of generating, among the three-phase alternating current, the U-phase high voltage side alternating current, and similarly to the first semiconductor element 23(U), is provided with a second power input terminal 331 and a second power output terminal 332, which are electrically connected correspondingly to the second connecting conductor 82(P), the third connecting conductor 83(U) and the like. Further, while having a configuration identical to that of the second semiconductor element 33(U), the second semiconductor element 34(V) has a high-side switching function of generating the V-phase high voltage side alternating current, and similarly to the second semiconductor element 33(U), is provided with a second power input terminal 341 and a second power output terminal 342, which are electrically connected correspondingly to the second connecting conductor 82(P), the third connecting conductor 83(U) and the like. Further, while having a configuration identical to that of the second semiconductor element 33(U) the second semiconductor element 35(W) has a high-side switching function of generating, among the three-phase alternating current, the W-phase high voltage side alternating current, and similarly to the first semiconductor element 23(U), is provided with a second power input terminal 351 and a second power output terminal 352, which are electrically connected correspondingly to the second connecting conductor 82(P), the third connecting conductor 85(W) and the like.

The frame 43 has a configuration identical to that of the frame 41, and is provided with a frame body 431, and a total of two positioning pins 432 and 433 arranged upright on the frame body 431. Furthermore, the pressing member 44 has a configuration identical to that of the pressing member 42, and is fixed and attached onto the frame body 431 of the frame 43. Further, an insulation sheet 32 having a configuration identical to that of the insulation sheet 22 is arranged on one side of the second cooling member 31, the surface 31A. Further, the circuit board 52 having a configuration identical to that of the circuit board 51 is a drive circuit board implemented with a driving IC 521 that drives and operates the switching of the second semiconductor elements 33(U) to 35(W), and is arranged with a pair of positioning holes 522 which conform to the positioning pins 432 and 433 of the frame 43.

The circuit board 55 that is positioned between the circuit board 51 and the circuit board 52 has a total of four positioning holes 555 which conform to the positioning pins 412 and 413 of the frame 41, and the positioning pins 432 and 433 of the frame 43.

That is, the circuit board 55, by insertion of the positioning pins 412, 413, 432, and 433 through the corresponding positioning holes 555, is positioned against the frames 41 and 43, together with the circuit board 51 positioned on the frame 41 by the positioning pins 412 and 413 inserted through the positioning holes 512, and the circuit board 52 positioned on the frame 43 by the positioning pins 432 and 433 inserted through the positioning holes 522, and is mounted in the case 7 using a fastening member such as screws (for which reference numeral is not assigned).

Furthermore, as described above, in the power electronic unit 1, by configuring the semiconductor module to be divided into two semiconductor modules, the first semiconductor module 2 and the second semiconductor module 3, which have an identical configuration and are interchangeable, positioning these opposite of each other on the top and bottom ends of the case 7, and using the third connecting conductors 83(U), 84(V), and 85(W), while assembly is simplified, the first output terminals 232 to 252 of the first semiconductor elements 23(U) to 25(W) are electrically connected to the third connecting conductors 83(U) to 85(W), the second output terminals 332 to 352 of the second semiconductor elements 33(U) to 35(W) are electrically connected to the third connecting conductors 83(U) to 85(W), and the third connecting conductors 83(U) to 85(W) are shared with the first semiconductor elements 23(U) to 25(W) and the second semiconductor elements 33(U) to 35(W).

In addition, in the power electronic unit 1, as the first connecting conductor 81(N) and the second connecting conductor 82(P) are used, while assembly is simplified, the first power input terminals 231 to 251 of the first semiconductor elements 23(U) to 25(W) are electrically connected to the first connecting conductor 81(N), and the second power input terminals 331 to 351 of the second semiconductor elements 33(U) to 35(W) are electrically connected to the second connecting conductor 82(P).

[Configuration Related to Case]

As shown in FIG. 1 to FIG. 4, the case 7 is typically integrally formed and made of a resin such as PPS (Polyphenylene Sulfide) resin. That is, the sidewall 71 of the case 7, extending in the vertical direction is typically obtained as an integrally formed rectangular shaped cylindrical piece, and while forming the internal space S on its inside, on opposite sides of each other on the sidewall 71 at both ends in the vertical direction, the second opening 7H2 and the first opening 7H1, which open the internal space S to the outer area, are formed at both ends.

As shown in FIG. 1 while omitting reference numerals thereof, on the four corners on the upper end of the sidewall 71, fastening holes (for which reference numeral is not assigned) having female screw threads are arranged, and using a fastening member, such as screws (for which reference numeral is not assigned), with these fastening holes, the second cooling member 31 of the second semiconductor module 3 is fixed, closing the second opening 7H2. Furthermore, although not shown in the drawings, fastening holes having female screw threads are also arranged on the four corners on the bottom end of the sidewall 71, and using a fastening member, such as screws (for which reference numeral is not assigned), with these fastening holes, the first cooling member 21 of the first semiconductor module 2 is fixed, closing the first opening 7H1. Furthermore, in such a case, in order to improve the positioning when mounting the first cooling member 21 and the second cooling member 31, in correspondence between both the top and bottom ends of the sidewall 71 and the first cooling member 21 and the second cooling member 31, an interlocking structure of concave and convex shapes, such as a combination of protrusions and matching grooves, may be arranged.

The first connecting conductor 81(N) and the second connecting conductor 82(P) are attached onto the case 7, and the third connecting conductors 83(U) to 85(W) are integrally formed with the sidewall 71 of the case 7. Accordingly, the first connecting conductor 81(N), the second connecting conductor 82(P), and the third connecting conductors 83(U) to 85(W), correspondingly through one penetration hole 711, one penetration hole 712, and a total of three penetration portions 713, arranged on the sidewall 71, extend outside of the case 7. As a sealing member is arranged in the gap between the first connecting conductor 81(N) and the second connecting conductor 82(P), and the corresponding penetration holes 711 and 712, while the third connecting conductors 83(U) to 85(W) are in close contact with the corresponding penetration portions 713, the internal space S is sealed.

Specifically, as shown in FIG. 1 and FIG. 2A to FIG. 2C, the second connecting conductor 82(P) extends outside, penetrating the side of the sidewall 71 parallel to the y-z plane and on the positive x-axis direction, through the penetration hole 712, forming a protruding end, and this protruding end acts as a second power input terminal 73 of the power electronic unit 1. Specifically, the second power input terminal 73 is electrically connected to the plus terminal of the battery. Furthermore, on the side of the sidewall 71 parallel to the y-z plane and on the positive x-axis direction, there is arranged a controlling connector 75 having control terminals which are electrically connected to the circuit board 55.

Figure 2A:
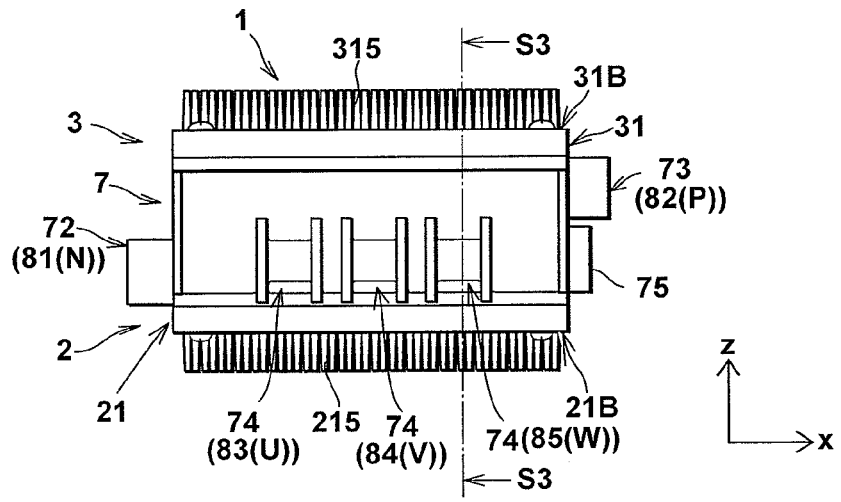
FIG. 2A is a front view of the power electronic unit according to the first embodiment as viewed along the direction of an arrow A in FIG. 1.
Figure 2B:
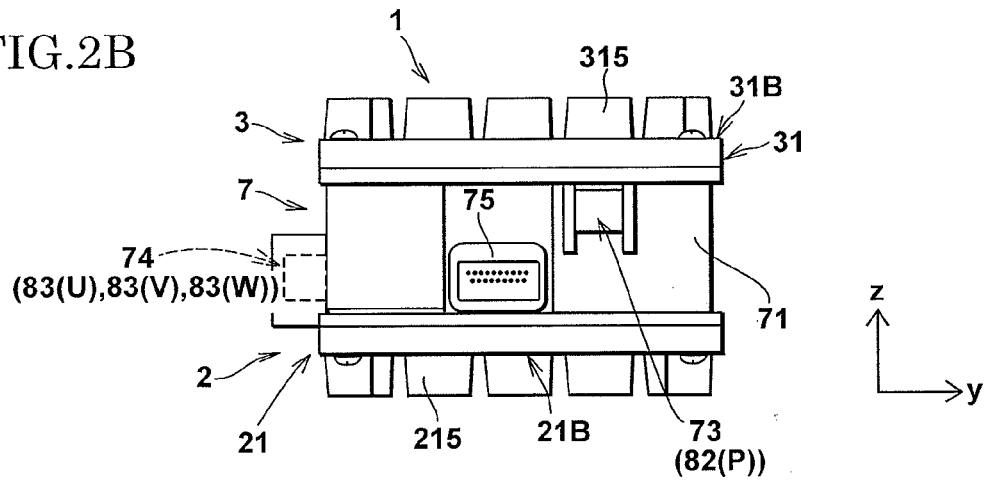
FIG. 2B is a side view of the power electronic unit according to the first embodiment as viewed along the direction of an arrow B in FIG. 1.
Figure 2C:
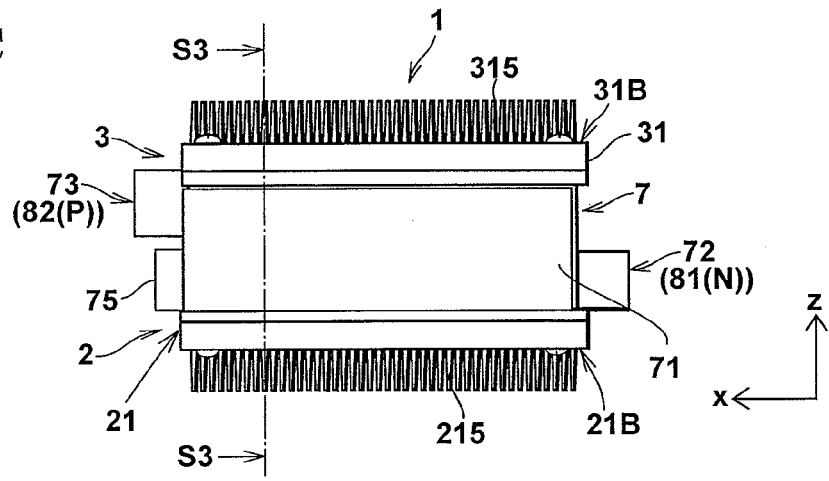
FIG. 2C is a back view of the power electronic unit according to the first embodiment as viewed along the direction of an arrow C in FIG. 1.

As shown in FIG. 1, FIG. 2A, and FIG. 2C, the first connecting conductor 81(N) extends outside, penetrating the side of the sidewall 71 parallel to the y-z plane and on the negative x-axis direction, through the penetration hole 711, forming a protruding end, and this protruding end acts as a first power input terminal 72 of the power electronic unit 1. Specifically, the first power input terminal 72 is electrically connected to the minus terminal of the battery.

As shown in FIG. 1, FIG. 2B, and FIG. 3, the third connecting conductors 83(U) to 85(W) individually extend outside, penetrating the side of the sidewall 71 parallel to the x-z plane and on the negative y-axis direction, through the corresponding penetration holes 713, forming protruding ends arranged in parallel in the x-axis direction, and these protruding ends act as output terminals 74 of the power electronic unit 1. Specifically, the output terminal 74 corresponding to the third connecting conductor 83(U) is electrically connected to the U-phase drive current input terminal of the electric motor, the output terminal 74 corresponding to the third connecting conductor 84(V) is electrically connected to the V-phase drive current input terminal of the electric motor, and the output terminal 74 corresponding to the third connecting conductor 85(W) is electrically connected to the W-phase drive current input terminal of the electric motor.

In detail, the third connecting conductors 83(U) to 85(W) are insert-molded to the case 7, and formed integrally with the sidewall 71 of the case 7. Specifically, the third connecting conductors 83(U) to 85(W), when molding the case 7, are each located beforehand in predetermined positions within the mold, and simultaneously as the sidewall 71 is molded during the molding of the case 7, these are adhered and fixed to the sidewall 71 in the penetration portions 713 formed in the sidewall 71.

Furthermore, as described above, in the power electronic unit 1, as the first semiconductor module 2 and the second semiconductor module 3 are correspondingly mounted on both the top and bottom ends of the cylindrical case 7, and the first connecting conductor 81(N), the second connecting conductor 82(P), and the third connecting conductors 83(U) to 85(W) are correspondingly extended outside of the case 7 in such a manner that they do not interfere with each other, while meanwhile the third connecting conductors 83(U) to 85(W) are integrally formed with the case 7 and are adhered and fixed to the sidewall 71 in the penetration portions 713 formed in the sidewall 71, the case 7 is reinforced improving its rigidness.

In addition, in the power electronic unit 1, as the first connecting conductor 81(N), the second connecting conductor 82(P), and the third connecting conductors 83(U) to 85(W) are correspondingly extended outside of the case 7 in such a manner that they do not interfere with each other, while an additional terminal board is omitted, particularly, the protruding ends of the first connecting conductor 81(N) and the second connecting conductor 82(P) correspondingly function as the first power input terminal 72 and the second power input terminal 73, and thus they can be electronically connected with the battery.

[Configuration Related to Connecting Conductor]

As shown in FIG. 1, FIG. 3, and FIG. 4, the first connecting conductor 81(N) is a current path where a relatively high electric current flows, and while efficiently using the gap portion within the internal space S of the case 7, extends this gap portion in the x-axis direction, and extending out of the sidewall 71 of the case 7 through the penetration hole 711, the protruding end is used as the first power input terminal 72. On the first power input terminal 72, there is arranged a fastening hole 815 having a female screw thread for fastening and supporting while electrically connecting the connection terminal of the electric wiring from the minus terminal of the battery.

Specifically, as shown in FIG. 3 in particular, the first connecting conductor 81(N) is, within the internal space S, appropriately distanced from the controlling IC 551 mounted on the circuit board 55 and its control current path which is a current path of a relatively low current, positioned below the circuit board 55 in the vertical direction, and in the horizontal direction, is a block structure having a horizontal block portion that extends in the x-axis direction in the gap portion between a part within the internal space S of the first semiconductor module 2 and the first condenser 91 and the second condenser 92.

That is, the first connecting conductor 81(N) is, not a member having a shape such as a thin line or a board, and is configured as a prismatic linear conductive block structure where the vertical cross-section in the y-z plane is of a rectangular shape. The first connecting conductor 81(N) itself is a block structure having enough volume and strength as a support member to support the mounting and fastening of the power input terminals corresponding to the first semiconductor elements 23(U) to 25(W), and the corresponding connection terminals of the first condenser 91 and the second condenser 92. Specifically, the first connecting conductor 81(N) is typically made of an aluminum alloy, and its aspect ratio, which in its vertical cross-section is the ratio of its width dimension in the y-axis direction and its thickness dimension in the z-axis direction, although dependant on the positioning and sizes of its fastening holes, is configured within the approximate range of 1:5 and 5:1.

As the first connecting conductor 81(N) is made of a conductive block structure and capable of securing plentiful measurements for fastening units, a total of three fastening holes 813 each having female screw threads are arranged facing upward from its bottom surface, and a total of two fastening holes 814 each having female screw threads are arranged facing downward from its top surface and upward from its bottom surface. The first power input terminal 251 of the first semiconductor element 25(W) is, using a fastening member 811 such as screws, to the bottom surface of the first connecting conductor 81(N) through the fastening holes 813, mechanically fastened, supported, and also electrically connected. Similarly, the first power input terminal 231 of the first semiconductor element 23(U) and the first power input terminal 241 of the first semiconductor element 24(V) are, individually, using the fastening member 811 shown using like reference characters, to the bottom surface of the first connecting conductor 81(N) through the fastening holes 813 shown using like reference characters, mechanically fastened, supported, and also electrically connected. In such a case, the fastening member 811 is fastened with a fastening tool (not shown) such as a screw driver having a straight handle, inserted into the internal space S through the penetration hole 211 of the first cooling member 21. While the connection terminals 912 of the first condenser 91 are mechanically fastened, supported, and also electrically connected to the top surface of the first connecting conductor 81(N) using fastening members 812 and the fastening holes 814, the connection terminals 922 of the second condenser 92 are mechanically fastened, supported, and also electrically connected to the bottom surface of the first connecting conductor 81(N) using the fastening members 812 and the fastening holes 814 each shown using like reference characters as those related to the first condenser 91.

In a case when the first connecting conductor 81(N) is configured as a block structure, as its material, instead of using a copper alloy or an iron alloy usually considered, it is preferable to use an aluminum alloy.

The reason therefor is, when the first connecting conductor 81(N) is made of a copper alloy, as the copper alloy is relatively superior in conductivity, the cross-sectional area perpendicular to the direction in with the current flows can be made smaller, and due to its high cost, a cabled structure having multiple thin lines or a bus bar shaped configuration with thin plates is likely to be used, thus eliminating the need to use a block structure. In such a case, the strength of the first connecting conductor 81(N) itself may not be enough to properly support the first power input terminals 231 to 251 of the first semiconductor elements 23(U) to 25(W) and the connection terminals corresponding to the first condenser 91 and the second condenser 92, let alone the difficulty of directly arranging the fastening holes 813 and 814 on itself. Furthermore, in this case, due to the smaller cross-sectional area, its perimeter and outer surface area are also smaller, leading to possibilities of unnecessary effects on each nearby element caused by an increase in the inductance against the currents flowing through the part, along with a reduction in the radiation of heat generated by the currents flowing through the part.

On the other hand, when the first connecting conductor 81(N) is made of an iron alloy, as the iron alloy is relatively inferior in conductivity, the cross-sectional area perpendicular to the direction in with the current flows needs to be made larger, resulting in the use of a configuration having a large cross-sectional area. In such a case, the size of the first connecting conductor 81(N) itself becomes too large, making it difficult to extend along the gap portion within the internal space S, and attempting to extend this along the mentioned gap portion requires the size of the case 7 itself to be larger.

Accordingly, for securing the performance while optimizing characteristics, such as electrical properties, mechanical properties, and the size thereof, of the first connecting conductor 81(N), in order to configure the first connecting conductor 81(N) as a block structure, it can be evaluated that it is preferable that this conductive material is made of an aluminum alloy. The above mentioned reasoning is the same with the other conductors, the second connecting conductor 82(P) and the third connecting conductors 83(U) to 85(W). Particularly, in the third connecting conductors 83(U) to 85(W), as the first output terminals 232 to 252 of the first semiconductor elements 23(U) to 25(W), the second output terminals 332 to 352 of the second semiconductor elements 33(U) though 35(W), and the U-phase to W-phase drive current input terminals of the electric motor can, to the third connecting conductors 83(U) to 85(W) correspondingly, be directly connected and mechanically supported together with being electrically connected, an additional terminal board can be omitted.

As shown in FIG. 1, FIG. 3, and FIG. 4, the second connecting conductor 82(P) is a current path where a relatively high electric current flows, and except for being attached at a position higher than the first connecting conductor 81(N) and in an upside-down manner when compared to the first connecting conductor 81(N), is a member identical to the first connecting conductor 81(N). That is, on the second connecting conductor 82(P), similarly to the first connecting conductor 81(N), fastening holes 823, 824, and 825 are arranged. In this case, the second power input terminal 331 of the second semiconductor element 33(U), the second power input terminal 341 of the second semiconductor element 34(V), and the second power input terminal 351 of the second semiconductor element 35(W) are, individually, using fastening members 821 shown using like reference characters, to the top surface of the second connecting conductor 82(P) to the fastening holes 823 shown using like reference characters, mechanically fastened, supported, and also electrically connected. While the connection terminals 911 of the first condenser 91 are mechanically fastened, supported, and also electrically connected to the top surface of the second connecting conductor 82(P) using fastening members 822 and the fastening holes 824, the connection terminals 921 of the second condenser 92 are mechanically fastened, supported, and also electrically connected to the bottom surface of the second connecting conductor 82(P) using the fastening members 822 and the fastening holes 824 each shown using the like reference characters as those related to the first condenser 91. The connection terminal of the electric wiring from the plus terminal of the battery is fastened, supported, and also electrically connected to the fastening hole 825.

As shown in FIG. 1, FIG. 3, and FIG. 4, the third connecting conductor 85(W) is a current path where a relatively high electric current flows, and in relation to the first connecting conductor 81(N) and the second connecting conductor 82(P), is arranged on the opposite side in the y-axis direction, while a portion of the first semiconductor module 2 positioned within the internal space S and portions of the circuit board 55 and the second semiconductor module 3 positioned within the internal space S are interposed therebetween, and while efficiently using the gap portion within the internal space S of the case 7, extends this gap portion in the y-axis direction, and extending out of the sidewall 71 of the case 7 through the penetration hole 713, the protruding end is used as the output terminal 74. On the output terminal 74 of the third connecting conductor 85(W), there is arranged a fastening hole 852 having a female screw thread for mechanically fastening and supporting the W-phase drive current input terminal of the electric motor.

Specifically, as shown in FIG. 3 in particular, the third connecting conductor 85(W) is, within the internal space S of the case 7, appropriately distanced from the controlling IC 551 mounted on the circuit board 55 and its control current path which is a current path of a relatively weak current. In the horizontal direction, the third connecting conductor 85(W) extends from the sidewall 71 in the y-axis direction around the gap portion leading to a part of the first semiconductor module 2 positioned within the internal space S, and has a prismatic and linear horizontal block portion where the vertical cross-section in the x-z plane is of a rectangular shape. In the vertical direction, the third connecting conductor 85(W) extends upright from near the portion of the first semiconductor module 2 positioned within the internal space S, and while penetrating a corresponding penetration hole 554 of the circuit board 55, as to bridge between the first output terminal 252 of the first semiconductor element 25(W) and the second output terminal 352 of the second semiconductor element 35(W), extends in the z-axis direction along the gap portion among the portion positioned within the internal space S of the first semiconductor module 2, the portion positioned within the internal space S of the circuit board 55 and the second semiconductor module 3, and the current sensor 552, and has a block structure having a prismatic and linear upright block portion, where the lateral cross-section in the x-y plane is of a rectangular shape, which joins the horizontal block portion. Furthermore, the penetration holes 554 may be a single hole through which all of the third connecting conductors 83(U) to 85(W) may be inserted.

That is, the third connecting conductor 85(W), although being of an L-shape when viewed in the x-axis direction, similarly to the first connecting conductor 81(N) and the second connecting conductor 82(P), is constituted by a conductive block structure made of an aluminum alloy, and its aspect ratio of its portion extending in the y-axis direction, which in its vertical cross-section in the x-z plane is the ratio of its width dimension in the x-axis direction and its thickness dimension in the z-axis direction, and its aspect ratio of its portion extending in the z-axis direction, which in its lateral cross-section in the x-y plane is the ratio of its width dimension in the x-axis direction and its depth dimension in the y-axis direction, are respectively configured within the approximate range of 1:5 to 5:1.

As the third connecting conductor 85(W) is made of a conductive block structure and capable of securing plentiful measurements for fastening units, and capable of securing a plentiful length across from the second semiconductor element 35(W) to the first semiconductor element 25(W), on the third connecting conductor 85(W), a top and bottom pair of fastening holes 851 each having female screw threads can be arranged on the opposite side. Particularly as shown in FIG. 3, the second output terminal 352 of the second semiconductor element 35(W), using fastening members 855 and the fastening holes 851, is mechanically fastened, supported, and also electrically connected to the top end surface of the upright block portion of the third connecting conductor 85(W). Similarly, the first output terminal 252 of the first semiconductor element 25(W), using the fastening members 855 and the fastening holes 851 each shown using like reference characters, is mechanically fastened, supported, and also electrically connected to the bottom end surface of the upright block portion of the third connecting conductor 85(W). In this case, the fastening members 855 are fastened with a fastening tool (not shown) such as a screw driver having a straight handle, inserted into the internal space S through the corresponding penetration hole 211 of the first cooling member 21 or the corresponding penetration hole 311 of the second cooling member 31.

The third connecting conductor 84(V) adjacently placed on the side in the negative x-axis direction in relation to the third connecting conductor 85(W), and the third connecting conductor 83(U) adjacently placed on the side in the negative x-axis direction in relation to the third connecting conductor 84(V) are each current paths where relatively high currents flow, and except for their attached positions differing from the third connecting conductor 85(W), are members identical to the third connecting conductor 85(W). That is, the third connecting conductor 83(U) and the third connecting conductor 84(V), similarly to the third connecting conductor 85(W), while efficiently using the gap portion within the internal space S of the case 7 and extending this gap portion in the y-axis direction, extend out from the sidewall 71 of the case 7, and these protruding ends are used as the output terminals 74. On the output terminals 74 of the third connecting conductor 83(U) and the third connecting conductor 84(V), fastening holes 832 and 842 having female screw threads are arranged to correspondingly mechanically fasten and support the U-phase and V-phase drive current input terminals of the electric motor. In this case, while the second output terminal 332 of the second semiconductor element 33(U), using a fastening member 835 and a fastening hole 831 having a female screw thread, is mechanically fastened, supported, and also electrically connected to the top end surface of the upright block portion of the third connecting conductor 83(U), the first output terminal 232 of the first semiconductor element 23(U), using a fastening member 835 and a fastening hole 831 having a female screw thread each shown using like reference characters, is mechanically fastened, supported, and also electrically connected to the bottom end surface of the upright block portion of the third connecting conductor 83(U). While the second output terminal 342 of the second semiconductor element 34(V), using a fastening member 845 and a fastening hole 841 having a female screw thread, is mechanically fastened, supported, and also electrically connected to the top end surface of the upright block portion of the third connecting conductor 84(V), the first output terminal 242 of the first semiconductor element 24(V), using a fastening member 845 and a fastening hole 841 having a female screw thread each shown using like reference characters, is mechanically fastened and supported while electrically connected to the bottom end surface of the upright block portion of the third connecting conductor 84(V). The U-phase drive current input terminal of the electric motor, through the fastening hole 832 arranged on the output terminal 74 of the third connecting conductor 83(U), is mechanically fastened, supported, and also electrically connected, and the V-phase drive current input terminal of the electric motor, through the fastening hole 842 arranged on the output terminal 74 of the third connecting conductor 84(V), is mechanically fastened, supported, and also electrically connected.

The first connecting conductor 81(N), the second connecting conductor 82(P), and the third connecting conductors 83(U) to 85(W) shall be block structure, capable of extending along corresponding gap portions within the internal space S and penetrating the sidewall 71 to protrude out of the case 7, having enough strength and volume to act as a supporting member that supports while mechanically fastening to another correspondingly mounted terminal, and having enough conductivity to conduct with another terminal. Therefore, the block structure may include a single block portion, or may be a combination of a plurality of block portions, and by appropriately combining similar block portions, its shape and the length of the current path may be easily expanded. Furthermore, as long as the block portion has a cross-section that does not generate excessive inductance or heat, the block portion is not limited to a shape having a rectangular cross-section, and may have a cross-section of such as another polygon or oval shape. Of course, the block portion, instead of extending as a linear block portion, may be a block portion extending in a curve shape, and instead of having the fastening portion on a flat surface, may have a fastening portion on an inclined surface.

As described above, additionally, in the power electronic unit 1, as the first connecting conductor 81(N), second connecting conductor 82(P), and third connecting conductors 83(U) to 85(W) where relatively high currents flow, and the control current paths where relatively low currents flow, are distanced from each other and distributed efficiently, the first connecting conductor 81(N), second connecting conductor 82(P), and third connecting conductors 83(U) to 85(W) are correspondingly extended in the gap portions of the internal space S, and the first connecting conductor 81(N), second connecting conductor 82(P), and third connecting conductors 83(U) to 85(W) are configured as a block structure, the configuration of the entire device is kept compact through the efficient use of the internal space S, and while an additional terminal board is omitted, the first output terminals 232 to 252 of the first semiconductor elements 23(U) to 25(W) are, to the third connecting conductors 83(U) to 85(W), mechanically fastened, supported, and also electrically connected, and the second output terminals 332 to 352 of the second semiconductor elements 33(U) to 35(W) are, to the third connecting conductors 83(U) to 85(W), mechanically fastened, supported, and also electrically connected, while meanwhile, the U-phase drive current input terminal of the electric motor is, to the third connecting conductor 83(U), mechanically fastened, supported, and also electrically connected, the V-phase drive current input terminal of the electric motor is, to the third connecting conductor 84(V), mechanically fastened, electrically connected, and also supported while being electrically connected, and the W-phase drive current input terminal of the electric motor is, to the third connecting conductor 85(W), mechanically fastened, supported, and also electrically connected.

[Assembling of Power Electronic Unit]

A method of assembling the power electronic unit 1 having the above configuration is described below in detail.

The case 7 is first molded and prepared. Specifically, the third connecting conductors 83(U) to 85(W) are located beforehand in predetermined positions within the mold, and thereafter, the resin material is injected into the mold. Subsequently, simultaneously as the sidewall 71 is molded, the third connecting conductors 83(U) to 85(W), in the penetration portions 713 formed in the sidewall 71, penetrate the sidewall 71. The injection of the resin material into the mold is then ended after being performed for a predetermined time, and when the mold is cooled, the third connecting conductors 83(U) to 85(W) are, in the penetration portions 713 of the sidewall 71, adhered and fixed to the sidewall 71. Thereafter, by removing the molded product from the mold, the case 7, with the third connecting conductors 83(U) to 85(W) fixed to the sidewall 71, is obtained.

First, the insulation sheet 22 is arranged on top of one side of the first cooling member 21, the surface 21A, the pressing member 42 is attached against the frame 41 accommodating the first semiconductor elements 23(U) to 25(W), and the circuit board 51 mounted with the driving IC 511 is attached. By fastening and attaching the frame 41 in the state described above onto one side of the first cooling member 21, the surface 21A, with the insulation sheet 22 in between, the first semiconductor module 2 is assembled.

At this time, through one pair of positioning holes 512 of the circuit board 51, a total of two positioning pins 412 and 413 arranged upright on the frame body 411 of the frame 41 are correspondingly inserted, and thus the circuit board 51 is positioned against the frame 41, and attached to a specific position in the first semiconductor module 2.

Similarly, the insulation sheet 32 is arranged on top of one side of the second cooling member 31, the surface 31A, the pressing member 44 is attached against the frame 43 accommodating the second semiconductor elements 33(U) to 35(W), and the circuit board 52 mounted with the driving IC 521 is attached. By fastening and attaching the frame 43 in the state described above onto one side of the second cooling member 31, the surface 31A, with the insulation sheet 32 in between, the second semiconductor module 3 is assembled.

At this time, through one pair of positioning holes 522 of the circuit board 52, a total of two positioning pins 432 and 433 arranged upright on the frame body 431 of the frame 43 are correspondingly inserted, and thus the circuit board 52 is positioned against the frame 43, and attached to a specific position in the second semiconductor module 3.

In addition, the first connecting conductor 81(N) penetrated through the penetration hole 711 through a sealing member and the second connecting conductor 82(P) penetrated through the penetration hole 712 through a sealing member are respectively attached to corresponding fixing parts (not shown) arranged on the sidewall 71 of the case 7.

Furthermore, to the first connecting conductor 81(N) and the second connecting conductor 82(P) in the above mentioned state, each using the corresponding fastening members 812 and 822 along with the fastening holes 814 and 824, the connection terminals 911 and 912 of the first condenser 91, and the connection terminals 921 and 922 of the second condenser 92, are fastened. With this configuration, the first condenser 91 and the second condenser 92, while being accommodated in the internal space S of the case 7, are attached to the first connecting conductor 81(N) and the second connecting conductor 82(P).

Next, with the case 7 in the state described above, with the first semiconductor module 2, the first semiconductor elements 23(U) to 25(W) are positioned within the internal space S through the first opening 7H1, and attached in such a manner that the other surface of the first cooling member 21, the surface 21B, is exposed to outside of the case 7, as to close the first opening 7H1 with the first cooling member 21.

At this time, by inserting the positioning pins 412 and 413 of the first semiconductor module 2 through the corresponding pair of positioning holes 555 of the circuit board 55, the circuit board 55, while being placed on a fixing part (for which reference numeral is not assigned), arranged above the circuit board 51 on the sidewall 71 of the case 7, is positioned against the first semiconductor module 2 attached to the case 7.

Next, with the case 7 in the state described above, with the second semiconductor module 3, the second semiconductor elements 33(U) to 35(W) are arranged within the internal space S through the second opening 7H2, and attached in such a manner that the other surface of the second cooling member 21, the surface 31B, is exposed to outside of the case 7, so as to close the second opening 7H2 with the second cooling member 31.

At this time, by inserting the positioning pins 432 and 433 of the second semiconductor module 3 through the remaining corresponding pair of positioning holes 555 of the circuit board 55, while the circuit board 55 and the second semiconductor module 3 are positioned, the circuit board 55 is attached to a fixing part in the case 7.

Next, while sequentially inserting a fastening tool (not shown) into the internal space S through the penetration hole 211 of the first cooling member 21, by fastening the fastening members 811 onto the corresponding fastening holes 813, the first power input terminals 231 to 251 of the first semiconductor elements 23(U) to 25(W) are fastened against the first connecting conductor 81(N), and by fastening the fastening members 835 to 855 onto the corresponding fastening holes 831 to 851, the first output terminals 232 to 252 of the first semiconductor elements 23(U) to 25(W) are fastened against the third connecting conductors 83(U) to 85(W).

Next, while sequentially inserting a fastening tool (not shown) into the internal space S through the penetration hole 311 of the second cooling member 31, by fastening the fastening members 821 onto the corresponding fastening holes 823, the second power input terminals 331 to 351 of the second semiconductor elements 33(U) to 35(W) are fastened against the second connecting conductor 82(P), and by fastening the fastening members 835 to 855 onto the corresponding fastening holes 831 to 851, the second power output terminals 332 to 352 of the second semiconductor elements 33(U) to 35(W) are fastened against the third connecting conductors 83(U) to 85(W).

Subsequently, according to need, by closing the penetration hole 211 of the first cooling member 21 and the penetration hole 311 of the second cooling member 31 using such as grommets (not shown), the assembly of the power electronic unit 1 is completed.

(Second Embodiment)

Figure 5:
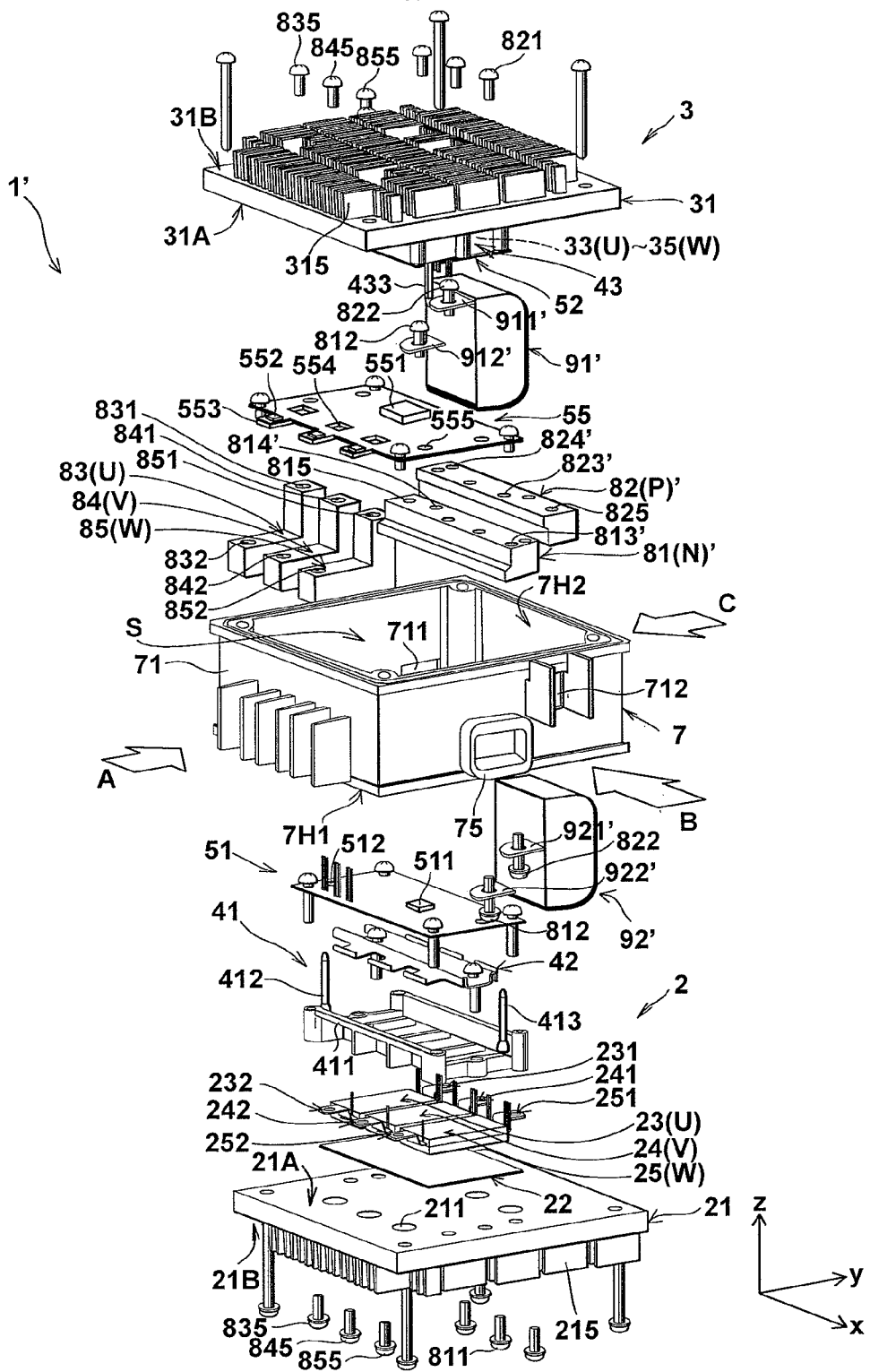
FIG. 5 is an exploded perspective view showing a power electronic unit according to a second embodiment of the present invention, in a state where one of its power modules is assembled.
Figure 6:
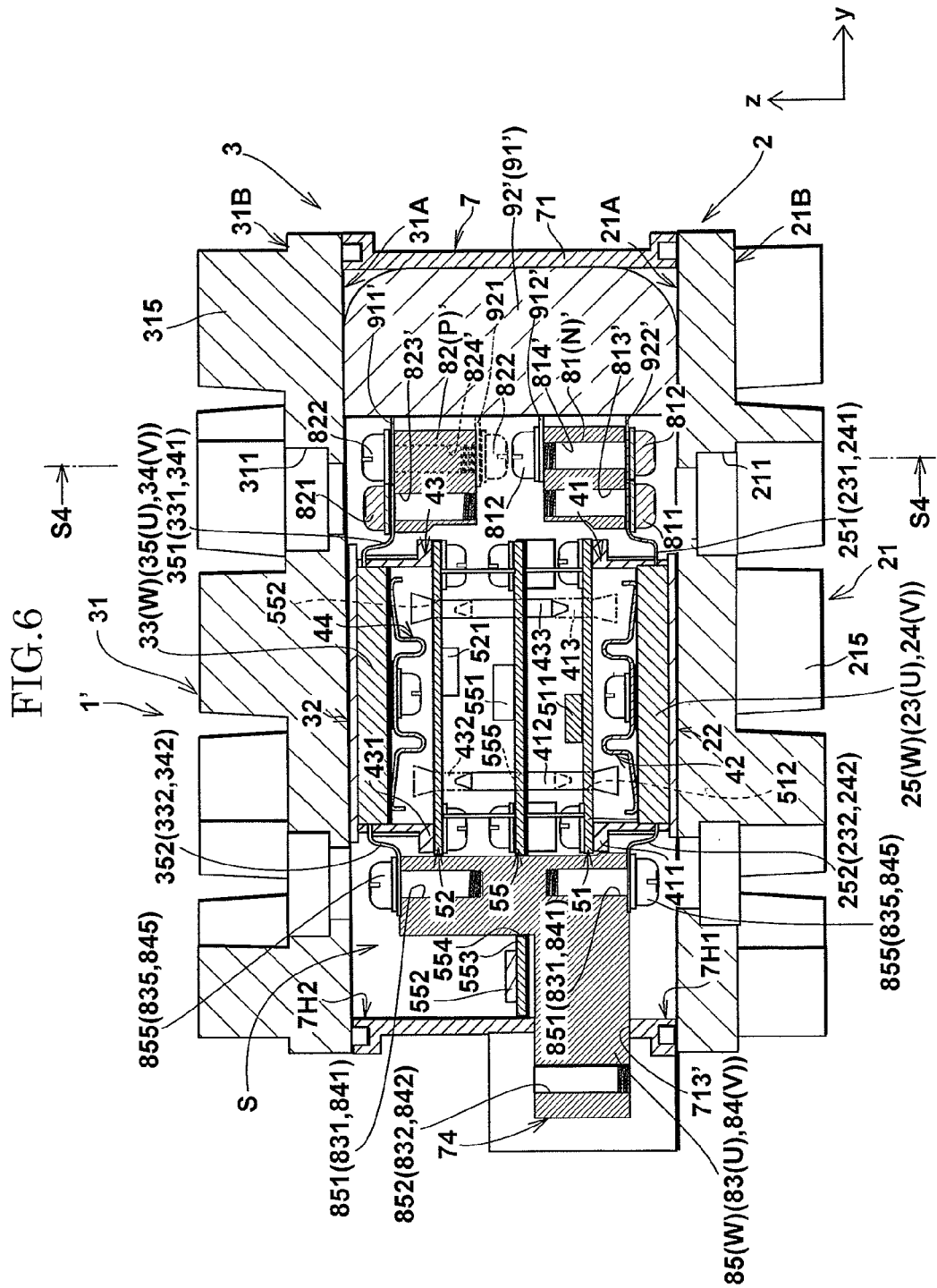
FIG. 6 is an enlarged detailed cross-sectional view of the power electronic unit according to the second embodiment, and is a drawing that corresponds to FIG. 3 in terms of position.
Figure 7A:
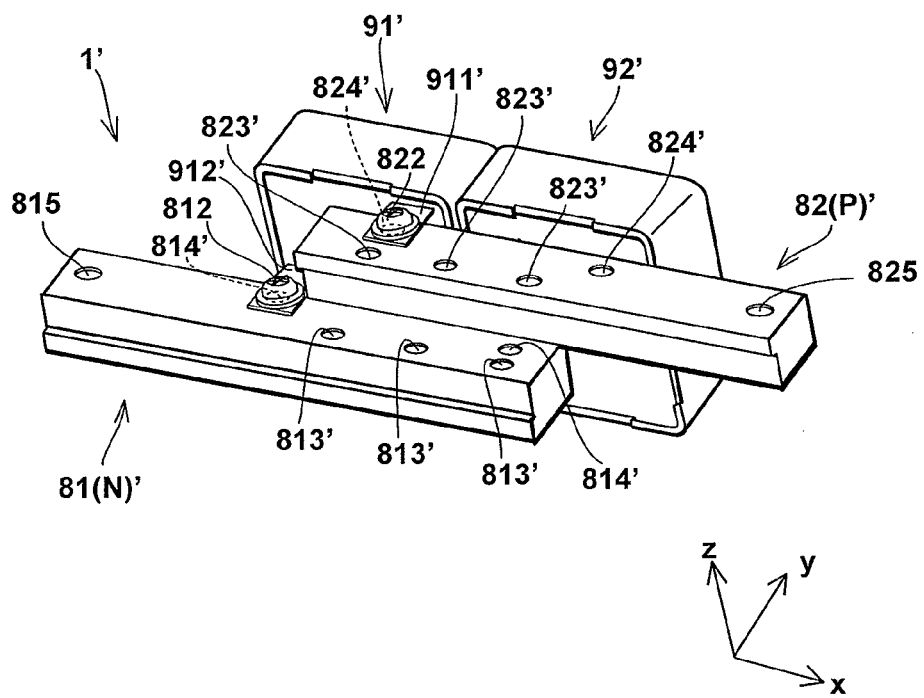
FIG. 7A is an enlarged perspective view of related portions of an input connecting conductor of the power electronic unit according to the second embodiment.
Figure 7B:
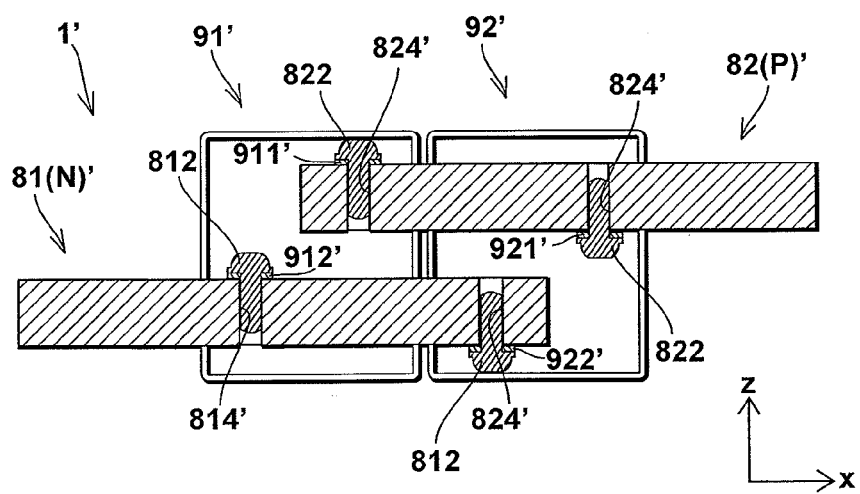
FIG. 7B is an enlarged vertical cross-sectional view of the input connecting conductor cut along a cross-sectional line S4-S4 in FIG. 6.

Next, a semiconductor control device according to a second embodiment of the present invention is described in detail also with reference to FIG. 5 to FIG. 7.

A semiconductor device 1' according to the present embodiment shown in further detail in FIG. 5 to FIG. 7B is, mainly different from that of the first embodiment for configurations of a first connecting conductor 81(N)' and a second connecting conductor 82(P)' being different, while the configuration of the rest remains the same. Therefore, in the present embodiment, the explanation will focus on the differences, and explanations of identical configurations are denoted by like reference characters and are abbreviated or omitted for convenience. Furthermore, with the present embodiment, a configuration, where the third connecting conductors 83(U) to 85(W) extend outside of the case 7 correspondingly to a total of three penetration holes 713' arranged on the sidewall 71, sealing members are arranged in the gaps between the third connecting conductors 83(U) to 85(W) and the corresponding penetration holes 713', and the internal space S is sealed, is used. However, this is not a limitation, and a configuration, where, similarly to the first embodiment, the third connecting conductors 83(U) to 85(W) are integrally formed at the total of three penetration portions 713 arranged on the sidewall 71, and extend outside of the case 7 correspondingly through these, may be used.

Specifically, the arrangement positions of each of fastening holes 813' and 814' of the first connecting conductor 81(N)' and the arrangement positions of each of fastening holes 823' and 824' of the second connecting conductor 82(P)' differ from those of the first embodiment, and correspondingly, the arrangement positions of each of first power input terminals 231' to 251' of first semiconductor elements 23(U)' to 25(W)', the arrangement positions of each of the second power input terminals 331' to 351' of second semiconductor elements 33(U)' to 35(W)', the arrangement positions of each of connection terminals 911' and 912' of a first condenser 91', and the arrangement positions of each of connection terminals 921' and 922' of a second condenser 92', differ from those of the first embodiment.

That is, regarding the relative positioning relation, in the x-axis direction, of the first connecting conductor 81(N)' and the second connecting conductor 82(P)', as the second connecting conductor 82(P)' is positioned above the first connecting conductor 81(N)', and the fastening hole 814' on the side of the upper surface of the first connecting conductor 81(N)' is arranged to deviate from the negative x-axis direction end of the second connecting conductor 82(P)' in the negative x-axis direction, even after the first connecting conductor 81(N)' and the second connecting conductor 82(P)' are fixed to the case 7, the fastening member 812 corresponding to the fastening hole 814' can be fastened from the upper side using a fastening tool (not shown) such as a screw driver having a straight handle. In addition, similarly, as the fastening hole 824' on the side of the lower surface of the second connecting conductor 82(P)' is arranged to deviate from the positive x-axis direction end of the first connecting conductor 81(N)' in the positive x-axis direction, even after the first connecting conductor 81(N)' and the second connecting conductor 82(P)' are fixed to the case 7, the fastening member 822 corresponding to the fastening hole 824' can be fastened from the lower side using a fastening tool (not shown) such as a screw driver having a straight handle.

The first condenser 91' and the second condenser 92' are, in relation to each of the first semiconductor elements 23(U)' to 25(W)' and the second semiconductor elements 33(U)' to 35(W)', electrically connected in such a manner that the overall connection paths from the first condenser 91' and the second condenser 92' are equivalent.

Specifically, the sum of the distance from the first condenser 91' to the second semiconductor element 33(U)' via a connection terminal 911', the second connecting conductor 82(P)' and the second power input terminal 331', and the distance from the second condenser 92' to the second semiconductor element 33(U)' via a connection terminal 921', the second connecting conductor 82(P)', and the second power input terminal 331', the sum of the distance from the first condenser 91' to the second semiconductor element 34(V)' via the connection terminal 911', the second connecting conductor 82(P)', and a second power input terminal 341', and the distance from the second condenser 92' to the second semiconductor element 34(V)' via the connection terminal 921', the second connecting conductor 82(P)', and the second power input terminal 341', the sum of the distance from the first condenser 91' to the second semiconductor element 35(W)' via the connection terminal 911', the second connecting conductor 82(P)', and a second power input terminal 351', and the distance from the second condenser 92' to the second semiconductor element 35(W)' via the connection terminal 921', the second connecting conductor 82(P)', and the second power input terminal 351', the sum of the distance from the first condenser 91' to the first semiconductor element 23(U)' via the connection terminal 912', the first connecting conductor 81(N)', and a first power input terminal 231', and the distance from the second condenser 92' to the first semiconductor element 23(U)' via a connection terminal 922', the first connecting conductor 81(N)', and the first power input terminal 231', the sum of the distance from the first condenser 91' to the first semiconductor element 24(V)' via the connection terminal 912', the first connecting conductor 81(N)', and a first power input terminal 241', and the distance from the second condenser 92' to the first semiconductor element 24(V)' via the connection terminal 922', the first connecting conductor 81(N)', and the first power input terminal 241', and the sum of the distance from the first condenser 91' to the first semiconductor element 25(W)' via the connection terminal 912', the first connecting conductor 81(N)', and a first power input terminal 251', and the distance from the second condenser 92' to the first semiconductor element 25(W)' via the connection terminal 922', the first connecting conductor 81(N)', and the first power input terminal 251', are configured to be equal to each other.

Furthermore, as described above, in the power electronic unit 1', as the first condenser 91' and the second condenser 92' are each electrically connected in a parallel manner with each other between the first connecting conductor 81(N)' and the second connecting conductor 82(P)', the fastening hole 814' on the side of the upper surface of the first connecting conductor 81(N)' is arranged to deviate from the negative x-axis direction end of the second connecting conductor 82(P)' in the negative x-axis direction, and the fastening hole 824' on the side of the lower surface of the second connecting conductor 82(P)' is arranged to deviate from the positive x-axis direction end of the first connecting conductor 81(N)' in the positive x-axis direction, even after the first connecting conductor 81(N)' and the second connecting conductor 82(P)' are fixed to the case 7, the fastening members 812 and 822 corresponding to the fastening holes 814' and 824' can be easily fastened. In addition, as the first condenser 91' and the second condenser 92' are, in relation to each of the first semiconductor elements 23(U)' to 25(W)' and the second semiconductor elements 33(U)' to 35(W)', connected electrically and in parallel via the first connecting conductor 81(N)' and the second connecting conductor 82(P)' in such a manner that each of the overall connection paths from the first condenser 91' and the second condenser 92' are equivalent, the contributions of the first condenser 91' and the second condenser 92' in relation to these are kept even, evenly smoothing out the direct current from the battery to the first semiconductor elements 23(U)' to 25(W)' and the second semiconductor elements 33(U)' to 35(W)'.

A method of assembling the power electronic unit 1' having the above configuration is explained below in detail.

In the present embodiment, without fixing the third connecting conductors 83(U) to 85(W) onto the sidewall 71 of the case 7 beforehand, similarly to the first embodiment, the first semiconductor module 2 is assembled as the second semiconductor module 3 is assembled.

In addition, the first connecting conductor 81(N)' penetrating the penetration hole 711 through the sealing member, the second connecting conductor 82(P)' penetrating the penetration hole 712 through the sealing member, and the third connecting conductors 83(U) to 85(W) correspondingly penetrating the penetration holes 713' through the sealing members are each attached to corresponding fixations (not shown) arranged on the sidewall 71 of the case 7.

Furthermore, with the first connecting conductor 81(N)' and the second connecting conductor 82(P)' in the state described above, by fastening the connection terminals 911' and 912' of the first condenser 91' and the connection terminals 921' and 922' of the second condenser 92', using each of the corresponding fastening members 812 and 822, and the fastening holes 814' and 824', the first condenser 91' and the second condenser 92', while being accommodated within the internal space S of the case 7, are attached to the first connecting conductor 81(N)' and the second connecting conductor 82(P)'.

At this time, as the fastening hole 814' on the side of the upper surface of the first connecting conductor 81(N)' is arranged to deviate from the negative x-axis direction end of the second connecting conductor 82(P)' in the negative x-axis direction, and the fastening hole 824' on the side of the lower surface of the second connecting conductor 82(P)' is arranged to deviate from the positive x-axis direction end of the first connecting conductor 81(N)' in the positive x-axis direction, the fastening members 812 and 822 corresponding to all of the fastening holes 814' and 824' are fastened using a fastening tool (not shown) such as a screw driver having a straight handle.

Next, similarly to the first embodiment, with the case 7 in the state described above, in the first semiconductor module 2, the first semiconductor elements 23(U)' to 25(W)' are then positioned within the internal space S through the first opening 7H1, and attached in such a manner that the other surface 21B of the first cooling member 21, the surface 21B, is exposed outside of the case 7, as to close the first opening 7H1 with the first cooling member 21, and in the second semiconductor module 3, the second semiconductor elements 33(U)' to 35(W)' are arranged within the internal space S through the second opening 7H2, and attached in such a manner that the other surface 31B of the second cooling member 31, the surface 31B, is exposed outside of the case 7, as to close the second opening 7H2 with the second cooling member 31.

Next, similarly to the first embodiment, while sequentially inserting a fastening tool (not shown) into the internal space S through the penetration hole 211 of the first cooling member 21, by fastening the fastening members 811 onto the corresponding fastening holes 813', the first power input terminals 231' to 251' of the first semiconductor elements 23(U)' to 25(W)' are fastened to the first connecting conductor 81(N)', and by fastening the fastening members 835 to 855 onto the corresponding fastening holes 831 to 851, the first output terminals 232 to 252 of the first semiconductor elements 23(U)' to 25(W)' are fastened to the third connecting conductors 83(U) to 85(W).

Next, similarly to the first embodiment, while sequentially inserting a fastening tool (not shown) into the internal space S through the penetration hole 311 of the second cooling member 31, by fastening the fastening members 821 onto the corresponding fastening holes 823', the second power input terminals 331' to 351' of the second semiconductor elements 33(U)' to 35(W)' are fastened to the second connecting conductor 82(P)', and by fastening the fastening members 835 to 855 onto the corresponding fastening holes 831 to 851, the second output terminals 332 to 352 of the second semiconductor elements 33(U)' to 35(W)' are fastened to the third connecting conductors 83(U) through 85(W).

Similarly to the first embodiment, as needed, by closing the penetration hole 211 of the first cooling member 21 and the penetration hole 311 of the second cooling member 31 using such as grommets (not shown), the assembly of the power electronic unit 1' is completed.

In the present invention, the shape, arrangement, and number or the like of constituent elements are not limited to those described in the above embodiments, and it is of course possible to appropriately modify the constituent elements without departing from the scope of the invention, such as replacing these elements with other ones that have identical operational effects.

As described above, because the present invention is capable of providing a semiconductor device capable of mechanically fastening, supporting, and also electrically connecting output terminals of the semiconductor element to input terminals of external devices and input terminals of the semiconductor element to connection terminals of related devices, while omitting an additional terminal board, for its general purpose and universal characteristics, its application can be expected in a wide range in fields of semiconductor devices, such as a power electronic unit.

Reference is hereby made to a Patent Application No. TOKUGAN 2011-210651 with a filing date of Sep. 27, 2011 in Japan, and a Patent Application No. TOKUGAN 2011-210652 with a filing date of Sep. 27, 2011 in Japan, the entire contents of which are incorporated herein by reference.

The present invention is not limited to the embodiments described above in respect of a kind, placement and the number of the component parts and it is of course to be understood that the relevant component parts may be suitably replaced by those having equivalent advantageous effects and alterations may be suitably made without departing from the scope of the present invention, in light of the teachings. The scope of the invention is defined with reference to the following claims.

What is claimed is:

1. A semiconductor device comprising:
   a semiconductor element;
   an input connecting conductor that electrically connects an input terminal of the semiconductor element;
   an output connecting conductor that electrically connects an output terminal of the semiconductor element; and
   a case accommodating the semiconductor element, a part of the input connecting conductor and a part of the output connecting conductor,
   wherein the input connecting conductor and the output connecting conductor are block structures opposed to each other with the semiconductor element being disposed between the input connecting conductor and the output connecting conductor, in the case.

2. The semiconductor device according to claim 1, wherein the output connecting conductor is the block structure that has a single layer structure and electrically connects the output terminal of the semiconductor element to a connection terminal of an external device.

3. The semiconductor device according to claim 2, wherein the case is made of a resin and the output connecting conductor is integrally formed with the case and fixed to the case.

4. The semiconductor device according to claim 2, wherein the output connecting conductor includes a screw fastening unit that fastens the output terminal or the connection terminal and the screw fastening unit, which fastens the connection terminal, is formed at a protruding end that is a portion of the output connecting conductor extending out from the case while penetrating the same.

5. The semiconductor device according to claim 2, wherein the output connecting conductor is made of an aluminum material.

6. The semiconductor device according to claim 1, further comprising: a condenser that is electrically connected to the semiconductor element,
   wherein the input connecting conductor includes a plurality of connecting conductors, and the input plurality of connecting conductors have single layer structures and electrically connect an input terminal of the semiconductor element to a connection terminal of the condenser.

7. The semiconductor device according to claim 6, wherein the plurality of connecting conductors includes a first connecting conductor and a second connecting conductor that is arranged to deviate from the first connecting conductor.

8. The semiconductor device according to claim 6, wherein each of the plurality of connecting conductors includes a screw fastening unit that fastens the input terminal or the connection terminal.

9. The semiconductor device according to claim 6, wherein the plurality of connecting conductors is made of an aluminum material.

\* \* \* \* \*